US005579209A

United States Patent [19]

Manson et al.

[11] Patent Number: 5,579,209

[45] Date of Patent: Nov. 26, 1996

[54] REMOTE CONTROL HOUSING WITH FUNCTIONAL ATTRIBUTES FOR A ROOM AIR CONDITIONER

[75] Inventors: Larry J. Manson, Baroda; Jerry L. McColgin, St. Joseph; Chris A. Scriber, Holland; Gary Bolin; Kenneth T. Shelley, both of St. Joseph, all of Mich.

[73] Assignee: Whirlpool Corporation, Benton Harbor, Mich.

[21] Appl. No.: 344,385

[22] Filed: Nov. 23, 1994

Related U.S. Application Data

[63] Continuation-in-part of Ser. No. 325,886, Oct. 19, 1994.

[51] Int. Cl.[6] ........ H05K 5/02

[52] U.S. Cl. ........ 361/814; 361/752; 361/796; 174/50

[58] Field of Search ........ 361/679, 752, 361/736, 796, 797, 814; 211/13, 70; 248/676; 455/73, 77; 174/50

[56] References Cited

U.S. PATENT DOCUMENTS

| | | | |
|---|---|---|---|
| 3,635,044 | 1/1972 | Hoth . | |
| 4,075,864 | 2/1978 | Schrader . | |
| 4,094,166 | 6/1978 | Jerles . | |
| 4,198,601 | 4/1980 | Ono et al. | 455/73 |
| 4,716,392 | 12/1987 | Nakano et al. | 335/189 |
| 5,246,183 | 9/1993 | Leyden | 242/107 |
| 5,319,942 | 6/1994 | Paustian et al. . | |
| 5,321,229 | 6/1994 | Holling et al. . | |
| 5,370,238 | 12/1994 | Czajkowski et al. | 211/13 |

*Primary Examiner*—Gerald P. Tolin
*Assistant Examiner*—Y. Whang
*Attorney, Agent, or Firm*—Hill, Steadman & Simpson

[57] ABSTRACT

A remote control unit for an air conditioner having a controller configured to process multiple temperature inputs, to provide a cycle of operation to provide comfort during sleeping, to provide an automatic cycle of operation wherein a burst of cooling air is provided on demand and/or which is configured to receive and respond to remote signals having different protocols. The remote control unit has a housing with a contoured rib that extends between two support pads so as to provide strength, rigidity and stability to the housing.

25 Claims, 21 Drawing Sheets

FIG. 19
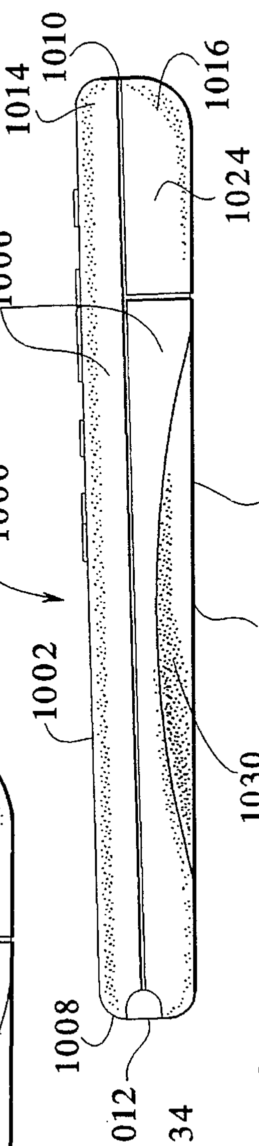
FIG. 18
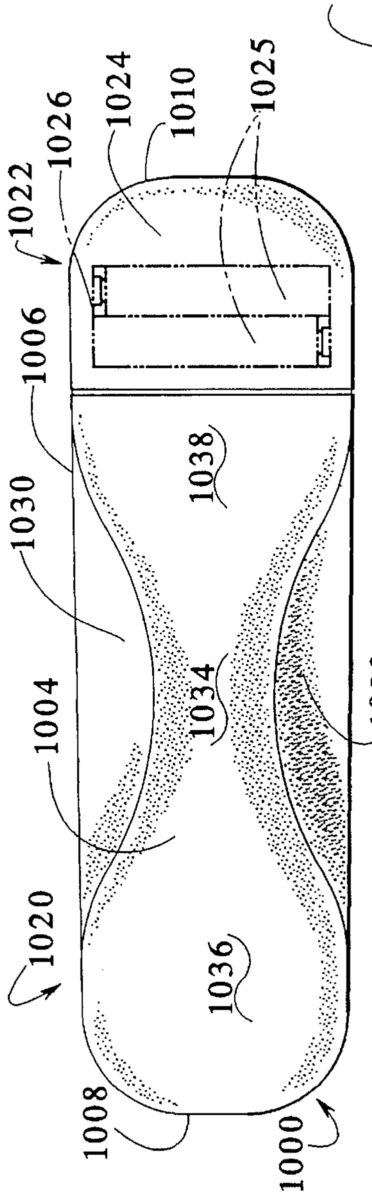
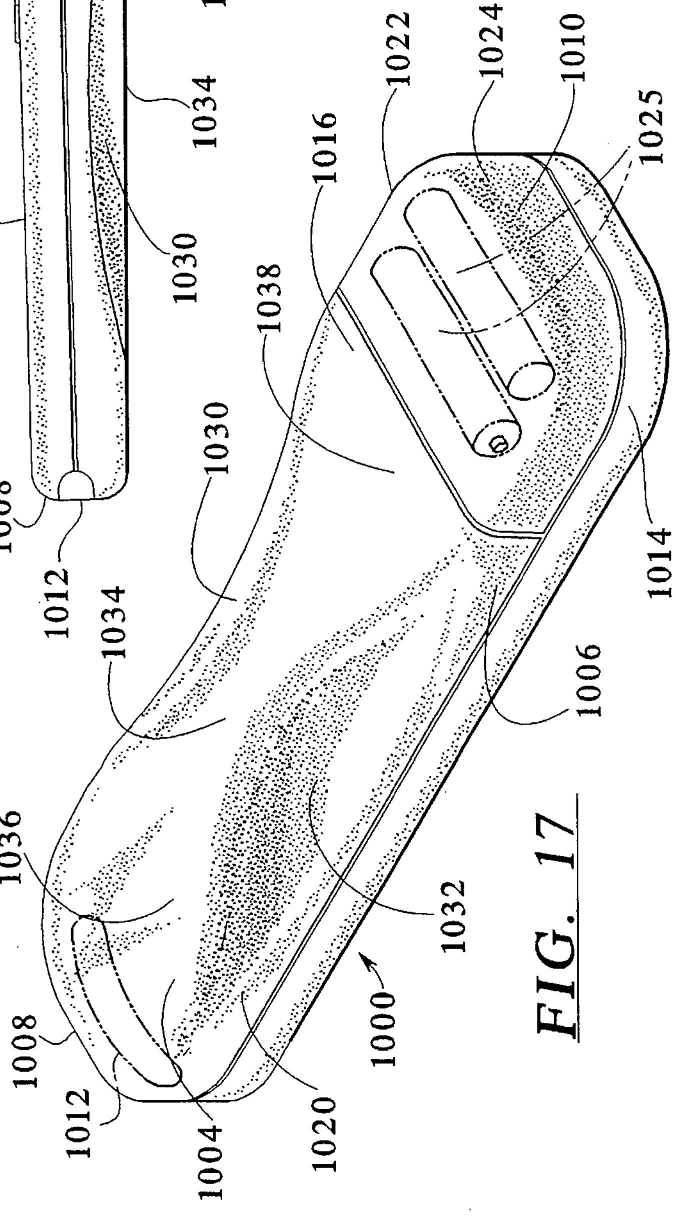
FIG. 17

REMOTE CONTROL HOUSING WITH FUNCTIONAL ATTRIBUTES FOR A ROOM AIR CONDITIONER

RELATED APPLICATION

This is a continuation-in-part of U.S. patent application Ser. No. 08/325,886 filed Oct. 19, 1994, and incorporated herein by reference, to the extent not already presented herein.

BACKGROUND OF THE INVENTION

The present invention relates to controllers for air conditioners. More particularly, the present invention relates to electronic controls for a window mounted air conditioner.

In the operation of an air conditioner, a compressor is used to compress a refrigerant which then flows through an evaporator having coils associated therewith whereby heat energy is absorbed from air flowing in close proximity to the evaporator coils. A fan, driven by an electric motor, is used to provide an air flow over the coils of the evaporator to enhance the extraction of heat energy from the air and to distribute the cooler air into a space. Such fans can be made to run continuously or selectively, and at variable speeds, depending on the circumstances.

Over the years, many different controllers have been developed to address, among other things, operating efficiency and customer preferences such as air temperature comfort levels. For further background information, one can review the following U.S. Pat. Nos. 5,319,942; 4,094,166; 4,075,864; and 3,635,044, all of which are incorporated herein by reference.

SUMMARY OF THE INVENTION

The present disclosure describes an air conditioner and/or control system therefor featuring one or more inventions. The inventions featured herein provide in some instances increased operational efficiency, and, in some instances, greater comfort levels and/or control over comfort levels.

In an embodiment of a first invention, there is provided a housing for a remote control unit having a bottom side with two support pads and a rib that extends along a longitudinal dimension of the housing between the two pads, each of the two pads being configured to support the housing on a planar surface at at least two laterally spaced apart positions, the rib forming two concave portions positioned on opposite lateral edges of the bottom side to provide spaces between the planar surface and the housing so that the housing can be lifted from the planar surface by insertion of one or more fingers in the spaces.

In an embodiment of the first invention, there is provided a remote control having the housing just discussed and circuitry contained within the housing for effecting remote control functions.

In an embodiment of a second invention, there is provided a control unit having arrow keys and a display and which is programmed to display at least a multiple-way arrow icon on the display and to associate functions with the arrows of the icon and the keys depending on control status of the control unit.

A multiple-way arrow means and refers to any of a four-way, a three-way or a two-way arrow. A four-way arrow means and refers to four orthogonally directed arrows which are directed outwardly from a common control point. Herein, the individual arrows are referred to as up, down, left and right arrows, the terms up, down, left and right when associated with arrow keys being well known. A three-way arrow includes only three of the just mentioned arrows, while a two-way arrow includes only two of the just mentioned arrows.

Further, herein the words "key" and "button" are used interchangeably, and, thus, the word "keystroke" also means and refers to the depression of a button which can be interpreted by a controller.

"Directional controller" as used herein means and refers to any device that can be used to provide one or more signals to a processor, which signal or signals are used to move a cursor about a screen and/or to ramp (i.e., increase or decrease) a variable. Examples of directional controllers contemplated under this definition include multiple-way keys, joy sticks, track balls, mice and the like.

Bidirectional controllers denote directional controllers that are restricted to control in only two directions. An example of a bi-directional controller is a two-way key.

Similarly, a tri-directional controller is a directional controller whose control is limited to three directions. An example of such a controller is a three-way key.

A directional controller such as a joy stick, mouse or track ball can be considered as a multiple-directional controller because a directional controller essentially is unlimited to specific directions.

In an embodiment of the second invention, the control unit is programmed to associate selection functions with the arrows of the icon depending on control programming modes selected by the user.

In an embodiment of the second invention, the control unit is programmed to display various menus on the display with functions selectable by way of a four-way arrow icon and a four-way arrow key.

In an embodiment of a third invention, there is provided an appliance for conditioning air, and/or method of operating same, having a controller which is configured to process multiple signals from a like multiple of sensors which sense the same climatic parameter, the controller being configured to process the multiple signals and to generate a composite value of the climatic parameter for use by the controller.

In an embodiment of the third invention, the climatic parameter is temperature.

In an embodiment of the third invention, the climatic parameter is average room temperature.

In an embodiment of the third invention, the multiple signals are averaged to generate the composite value.

In an embodiment of the third invention, the multiple signals are averaged and then an adjustment factor is added thereto to generate the composite value.

In a more particular embodiment of the third invention, at least one sensor is located remotely from the appliance so that the signals represent spatially separated sensings of the same climatic parameter.

In an embodiment of the third invention, there is provided an apparatus and method for processing in an air conditioner multiple temperature signals from a like multiple of temperature sensors. Preferably, the temperature sensors are spatially separated so as to provide information regarding air temperature at different locations within a space, the air temperature of which is to be conditioned by the air conditioner.

In an embodiment of the third invention, the multiple temperature signals are averaged and then an adjustment factor is added to the resulting average to generate a composite signal.

In an embodiment of the third invention, the composite signal resulting from the foregoing is employed by the air conditioner controller as a measure of temperature to compare against a temperature set point.

In an embodiment of a fourth invention, there is provided a cycle of operation of an air conditioner wherein a temperature set point is varied over the course of the cycle.

In an embodiment of this fourth invention, there is provided a cycle of operation of an air conditioner wherein a temperature set point is adjusted from a starting value by a predetermined amount over the course of a predetermined period of time and then returned to the starting value upon termination of the cycle.

In an embodiment of this fourth invention, if the set point is adjusted manually during the cycle, the change in the set point is memorized so that upon subsequent execution of the cycle, the predetermined amount by which the set point is varied accounts for the prior manual adjustment.

In an embodiment of a fifth invention, the cycle of operation of the second invention can be entered regardless of a current cycle of operation of the air condition, and upon completion, will allow the air conditioner controller to resume the prior cycle of operation.

In an embodiment of the fifth invention, the cycle of operation of the second invention can be entered regardless of a current cycle of operation of the air conditioner, and upon completion, will allow the air conditioner to enter any previously programmed cycle of operation.

In an embodiment of a sixth invention, there is provided a cycle of operation of an air conditioner wherein upon entering the cycle, cooling at a high fan speed is undertaken for a predetermined period of time if sensed temperature is less than a temperature set point.

In an embodiment of this sixth invention, if the cycle is re-entered while in that cycle and following the initial cooling at a high fan speed for a preselected period of time, the cycle is restarted.

In an embodiment of the sixth invention, the starting set point is a function of starting and ending set points memorized during the last time that the cycle was selected.

In an embodiment of the sixth invention, the function of the memorized starting and ending set points just referred to is the average of the memorized starting and ending set points with an integer round-off that forces the starting set point to change, only if a 1° C. difference exists between the starting set point and calculated set point.

In an embodiment of a seventh invention, there is provided an air conditioner controller that is responsive to remotely transmitted signals having different protocols.

In an embodiment of the seventh invention, the various protocols in common comprise a message signal which in turn comprises a remote transmitter identifier portion and a useful data portion.

In an embodiment of the seventh invention, the useful data portion comprises keystroke data.

In an embodiment of the seventh invention, the useful data portion comprises remote sensor data.

In an embodiment of the seventh invention, the useful data portion comprises control state data.

In an embodiment of the seventh invention, the control state data comprises data establishing a current desired state of operation, a future desired state of operation, and a time for assuming such future state of operation.

These and other features of the presently preferred embodiments will become clearer below with reference to the following detailed description of the presently preferred embodiments with reference to the accompanying drawings.

BRIEF DESCRIPTION OF THE DRAWINGS

FIG. 17 illustrates in perspective view a housing for the remote control unit of FIG. 3.

FIG. 18 illustrates a bottom side of the housing of FIG. 17.

FIG. 19 illustrates a side view of the housing of FIG. 17.

DETAILED DESCRIPTION OF THE PRESENTLY PREFERRED EMBODIMENTS

Figure 1:
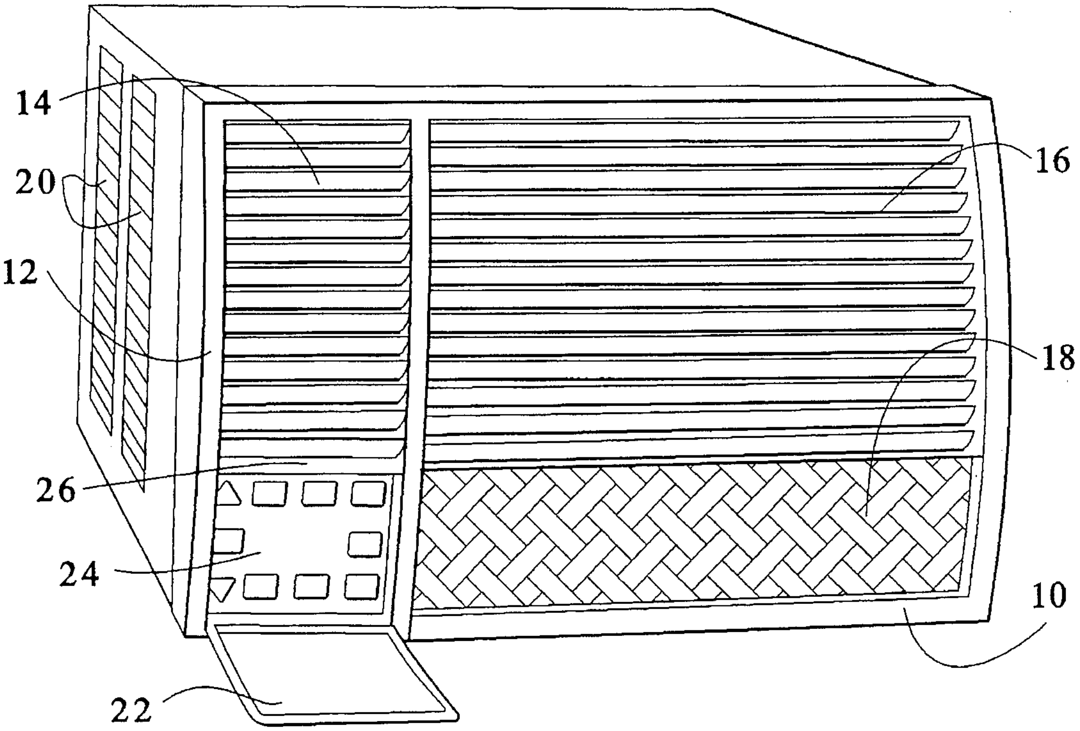
FIG. 1 illustrates in perspective view a window mounted air conditioner in which the presently preferred embodiment can be incorporated.

In FIG. 1 there is illustrated in perspective view an air conditioner in which the inventions and features described below can be employed. FIG. 1 illustrates an air conditioner 10 made or to be made by or for Whirlpool Corporation.

Figure 2:
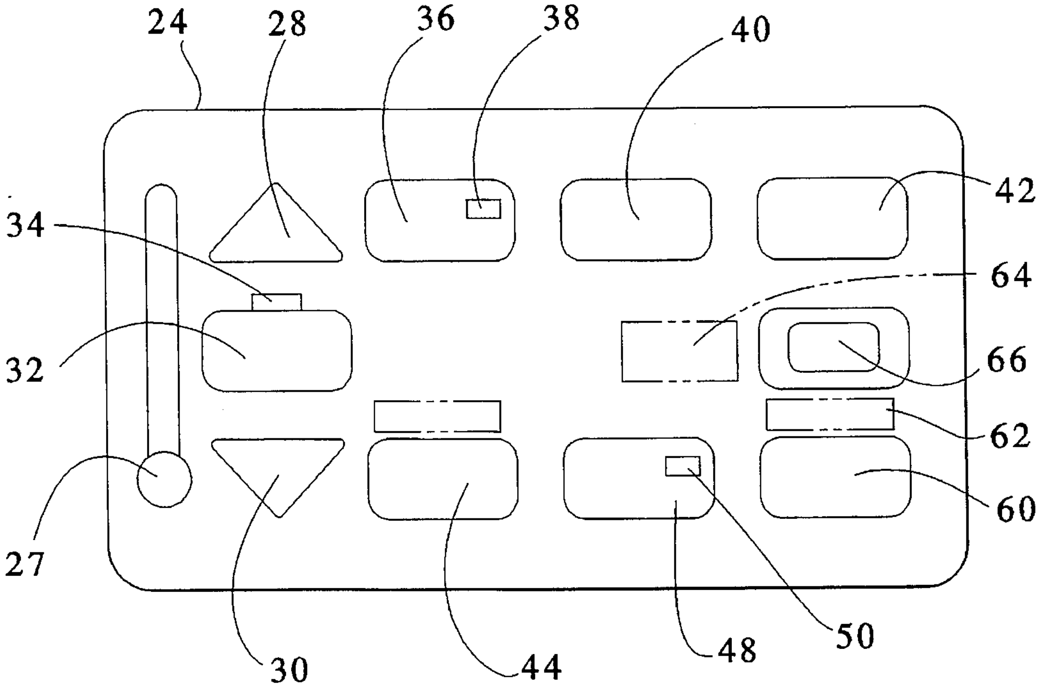
FIG. 2 illustrates a control panel key pad for a control system embodying one or more of the inventions described herein.

As illustrated, such an air conditioner 10 includes a front face 12 having air output louvers 14 and inside air intake louvers 16 and a decorative panel 18. On one or both sides of the air conditioner 10 are outside air intake louvers, through which outside air is drawn into the air conditioner 10. As part of the decorative panel 18, there is included a control panel door 22 which when opened exposes a control keypad panel 24 which is illustrated in FIG. 2 and further described below. It can be seen, however, that protruding just above the control panel door is an infrared sensor 26.

With reference now to FIG. 2, the control panel 24 for the air conditioner 10 will now be described. As illustrated, the control panel 24 for the air conditioner 10 includes the following features:

(a) A temperature set point indicating gauge 27 by which means of which a user can be visually signalled as to whether the temperature set point is being increased or decreased by the user. As will be described more fully below, preferably this temperature gauge 27 simulates a liquid based thermometer in appearance complete with bulb and stem and the visual indications are provided by discrete light emitting diodes vertically positioned along what would be the length of the stem so as to visually indicate an increase or decrease in temperature set point.

(b) A "WARMER" button 28 by means of which a user can manually incrementally increase, preferably in 1° C. increments, a temperature set point by depressing the button 28.

(c) A "COOLER" button 30 by means of which a user can manually incrementally decrease, preferably in 1° C. increments, a temperature set point by depressing the button 30.

(d) An "AUTO COOL/ON" button 32 by means of which a user can either turn the air conditioner 10 on, or if the air conditioner is already on, to select an "AUTO COOL" cycle of operation, more fully described below.

(e) A visual indicator 34, preferably in the form of a light emitting diode, is provided to indicate whether the air conditioner 10 is in an AUTO COOL cycle of operation.

(f) A "DRY ONLY" button 36 by means of which a user can select a dehumidifying cycle of operation in which the air conditioner removes excess moisture from room air without providing much cooling. The "DRY ONLY" cycle is activated by depressing the "DRY ONLY" button 36 and at that time a visual indicator 38 positioned within the button, preferably a light emitting diode, will be illuminated.

(g) A "FAN SPEED" button 40 by means of which a user can modify the operating speed of the air conditioner fan. As will be described further below, each press of the "FAN SPEED" button 40 advances the fan speed through a selection cycle from "high speed" to "medium speed" to "low speed" and then back to "high speed".

(h) An "AIR SWING" button 42 by means of which a user can activate a driving motor that drives further vertical air output louvers (not illustrated) from side to side thereby to swing cool air through the room. This feature is activated by depressing the "AIR SWING" button 42, and then deactivated by again pressing the "AIR SWING" button 42.

(i) A "SLEEP HOURS" button 44 by means of which a user can select a "SLEEP HOURS" cycle of operation described more fully below which allows the air conditioner 10 to optimize comfort while the user is sleeping. The "SLEEP HOURS" button 44 is pressed until a number for the desired time period for the "SLEEP HOURS" cycle is lit. Numerals 46, preferably backlit by light emitting diodes, indicate selectable three hours, five hours or eight hours of operation.

(j) A "FAN ONLY" button 48 that upon depressing allows a user to select and circulate air in the room without cooling. This cycle of operation is activated by pressing the "FAN ONLY" button 48 at which point a visual indicator positioned within the button, preferably a light emitting diode, is illuminated.

(k) A "TIMED OFF HOURS" button 60 which allows a user to select a "TIMED OFF HOURS" cycle of operation whereby the air conditioner is programmed to turn itself off after a set period of time. Once the cycle is activated, the unit continues in the current operating cycle until the "TIMED OFF HOURS" cycle is complete. Numerals 62, preferably backlit by light emitting diodes, are provided for selection of timed out periods of one, three and five hours. This cycle of operation is selected by pressing of the "TIMED OFF HOURS" button 60 until a number for the desired time period is lit.

(l) A "CHECK FILTER" visual indicator 64, preferably the words "CHECK FILTER" backlit by light emitting diodes, that comes on approximately every 100 hours of operation to alert a user to check an air filter in the air conditioner 10 to see if it needs cleaning.

(m) An "OFF" button 66 by means of which the air conditioner would be turned off and further by means of which the check filter visual indicator 64 can be deactivated. To deactivate the check filter visual indicator 64, the air conditioner control system can be programmed to accept repetitive depressions of the "OFF" button 66 as an indication to deactivate the check filter visual indicator 64.

Figure 3:
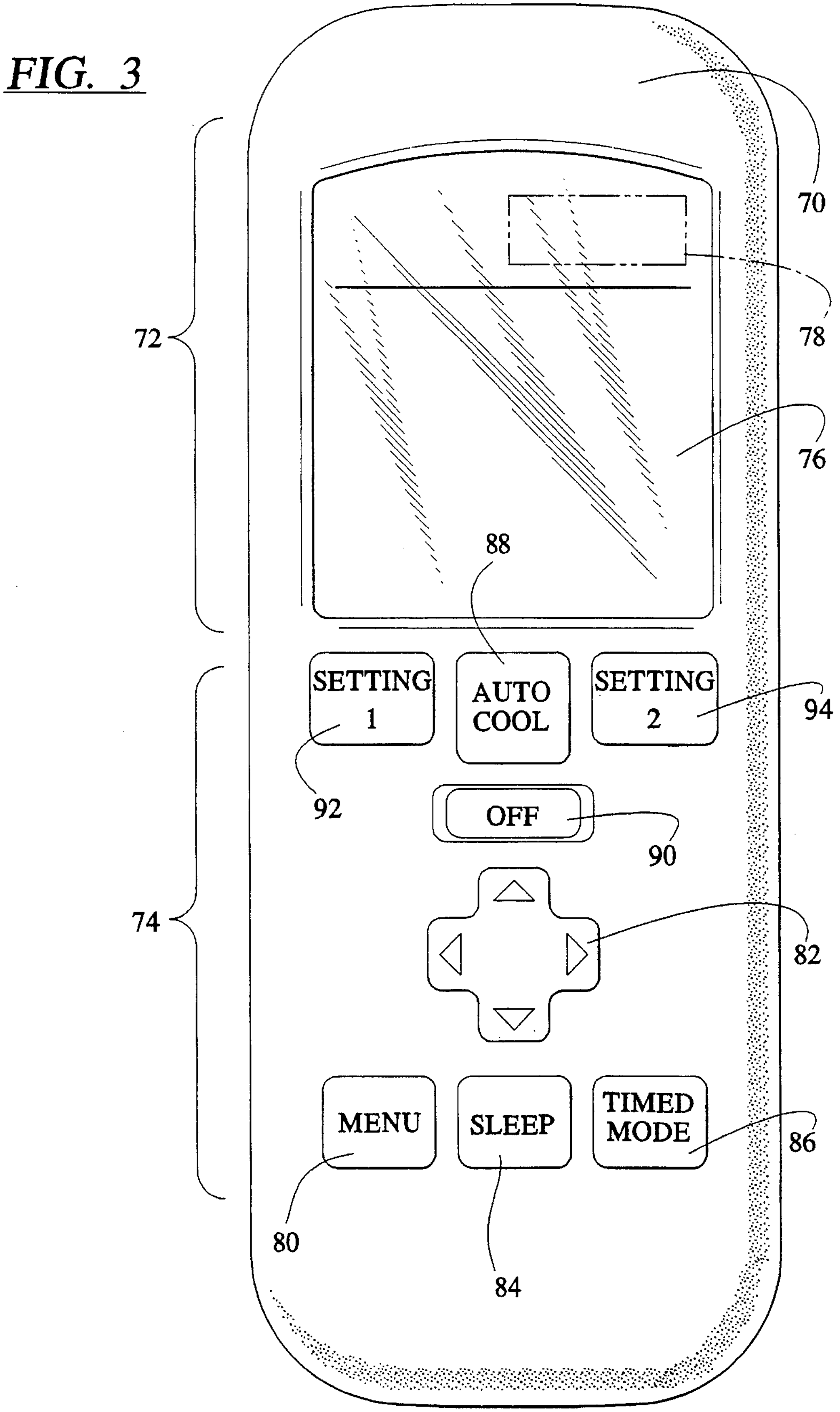
FIG. 3 illustrates a first hand-held remote transmitter (remote control unit) that can be utilized to send remote command signals to an air conditioner control system incorporating one or more of the inventions described herein.

In FIG. 3 there is illustrated a remote control unit 70 that can be employed to remotely control operation of the air conditioner 10. This remote control unit 70 includes a display section 72 and a command button section 74. In the display section 72, there is provided a display or display element 76, preferably a liquid crystal display, for displaying features, as they are selected, as well as a digital real time clock 78 (which displays real time as kept by the remote 70).

The command button or key section 74 has several buttons allowing for the selection of various control features of the air conditioner. In that regard, a menu button 80 is included to produce a menu on the display 76 which will then direct a user to various selections for programming operation of the air conditioner 10. A directional controller in the form of a four-way arrow key 82 (operatively associated with four switches as discussed below with reference to FIG. 21D) can be employed to make selections offered on the display 76 or to move a cursor thereabout. A "SLEEP" button 84 allows the user to select the "SLEEP HOURS" cycle of operation. A "TIMED MODE" button 86 allows a user to select and/or display an indication of the type and the timing of a future event such as the turning off of or going to a specific cycle will occur, set a start or stop time, or to a clear start and stop times. An "AUTO COOL" button 88 allows a user to select the "AUTO COOL" cycle of operation described previously, and, of course, an "OFF" button 90 allows a user to turn the air conditioner 10 off.

The remote control circuit 70 provides for wireless communication with the controller of the air conditioner 10, preferably via the infrared sensor 26. Accordingly, the remote control unit 70 preferably operates much like any of the currently available remote TV controls, although the format of the transmitted signal differs somewhat in content as described more fully below.

Figure 4:
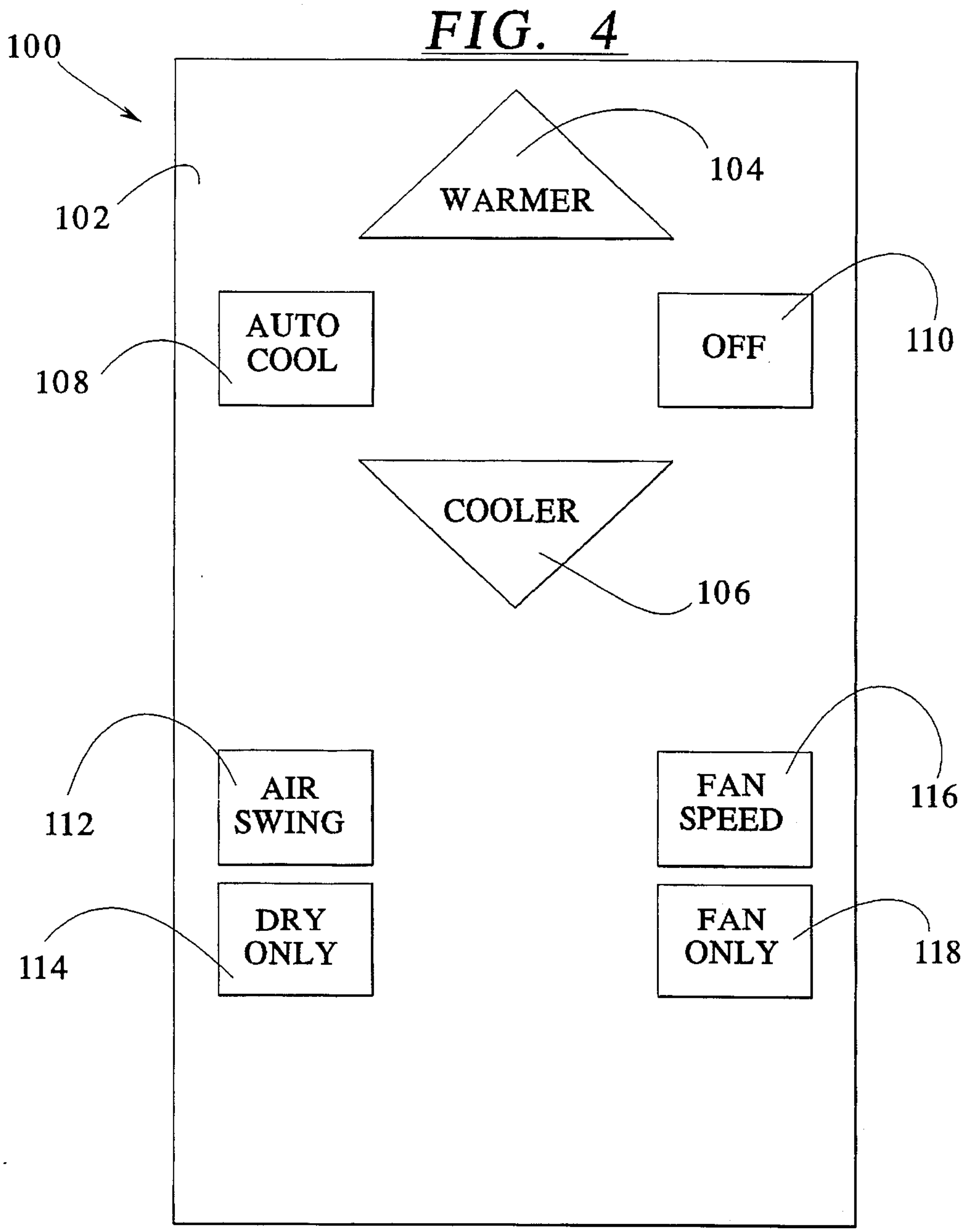
FIG. 4 illustrates a second remote transmitter that can be utilized to send remote command signals to an air conditioner control system incorporating one or more of the inventions described herein.

In FIG. 4, there is illustrated another remote control unit 100 referred to as a credit card type remote due to its dimensions, i.e., it is not much bigger or thicker than a typical credit card. This type of remote 100 has a control panel 102 that substantially mimics the control panel 24 of the air conditioner 10. As can be seen, the control panel 102 of this credit card type remote 100 includes cycle selecting buttons that are similar to those present on the control panel 24 of the air conditioner 10. In that regard, on the credit card remote control panel 102 is a "WARMER" button 104, a "COOLER" button 106, an "AUTO COOL" button 108, an "OFF" button 110, an "AIR SWING" button 112, a "DRY ONLY" button 114, a "FAN SPEED" button 116 and a "FAN ONLY" button 118 which operate the cycles described above. However, this credit card type remote 100 does not include the various visual indicators that are present on the main control panel 24 on the air conditioner 10.

The remote 100 also communicates with the controller of the air conditioner 10 via wireless infrared transmissions. As described below, the format of the signal transmitted by the remote 100 is very similar to that of most remote TV controllers.

Figure 5:
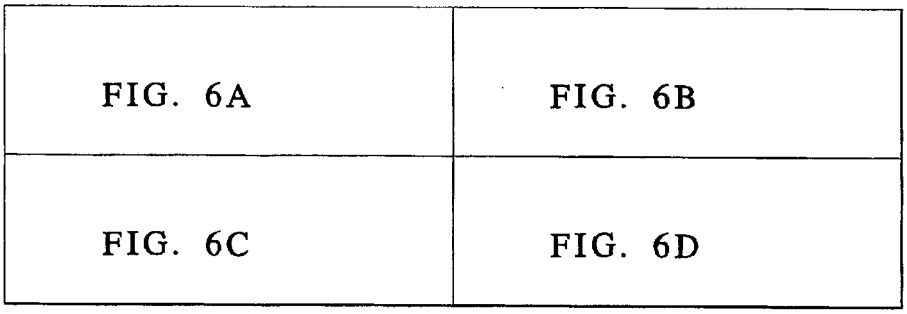
FIG. 5 illustrates the interconnections and inter-relationships between various portions of the schematic illustrated in FIGS. 6A to 6D.
Figure 6A:
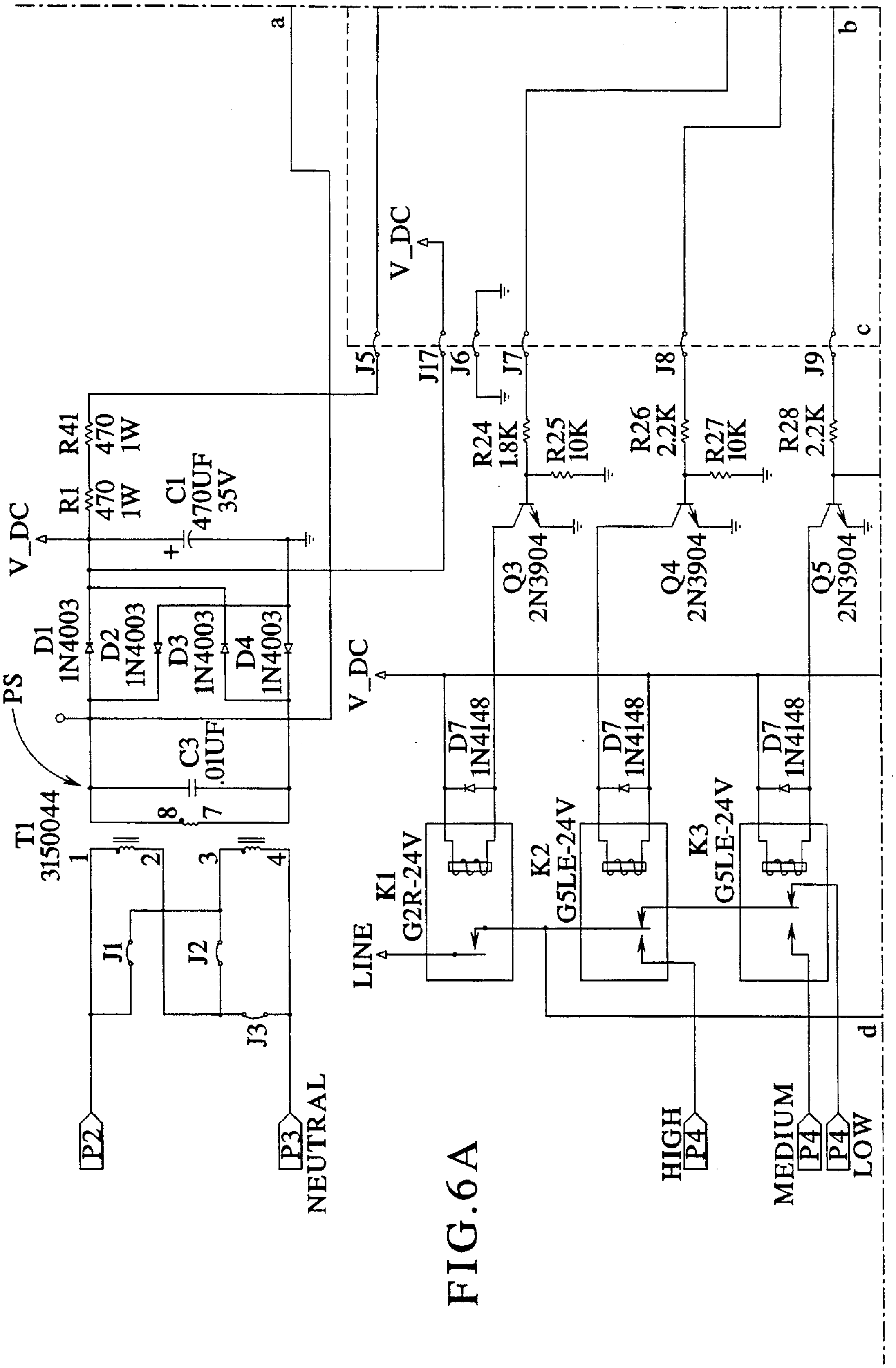
FIGS. 6A to 6D illustrate a schematic of an electronic control system that can embody one or more of the inventions described herein.
Figure 6B:
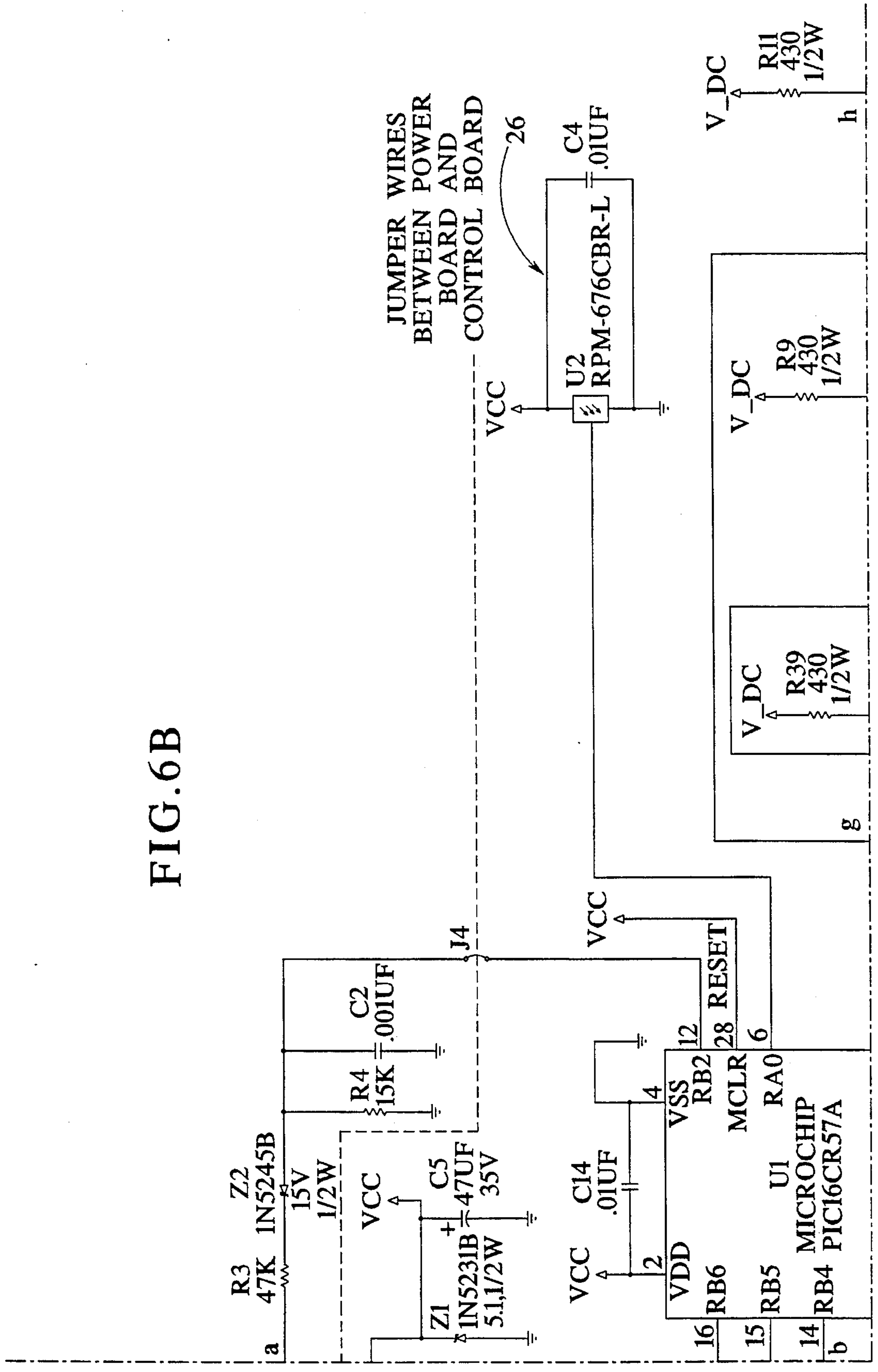
Figure 6C:
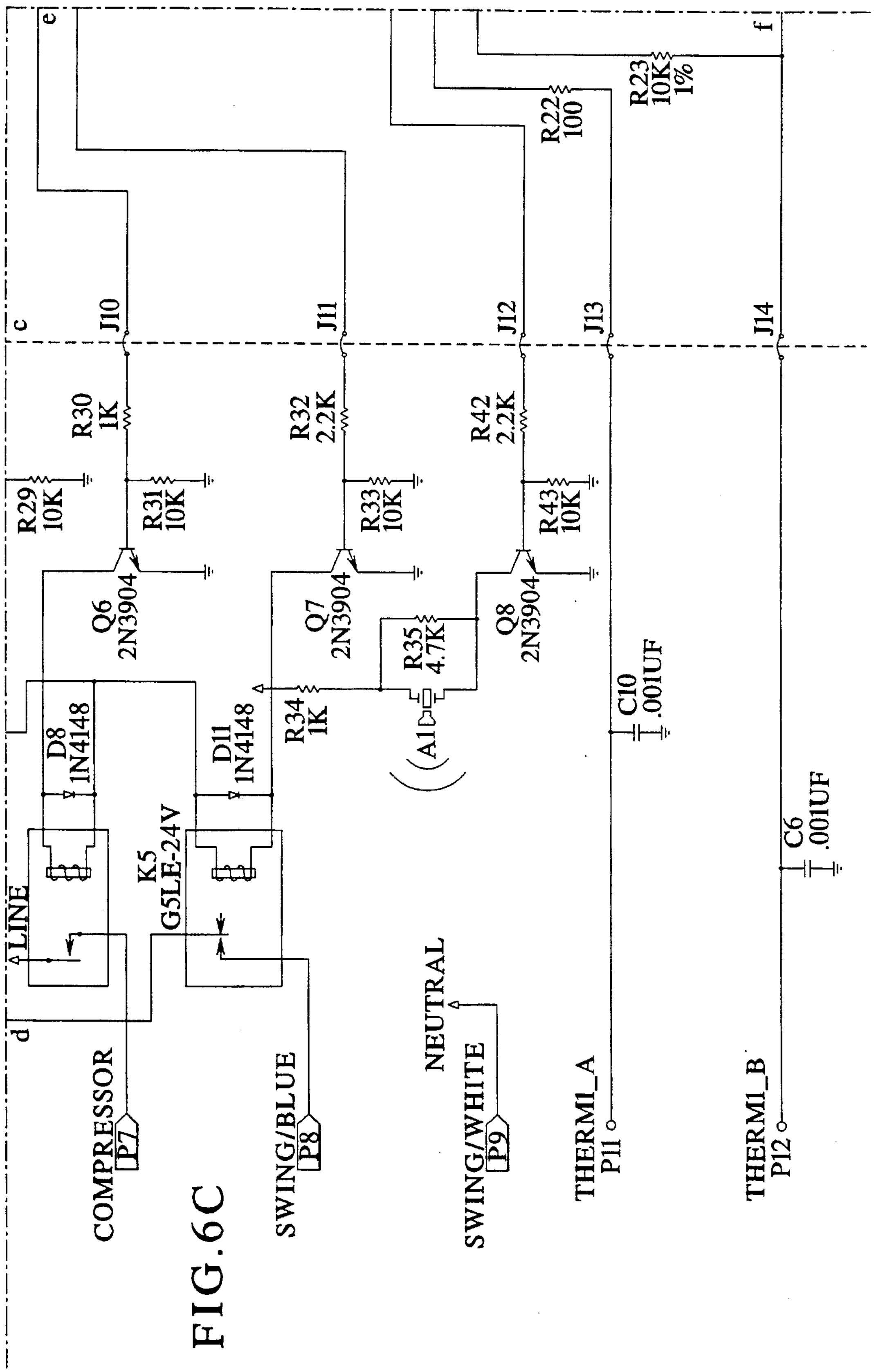
Figure 6D:
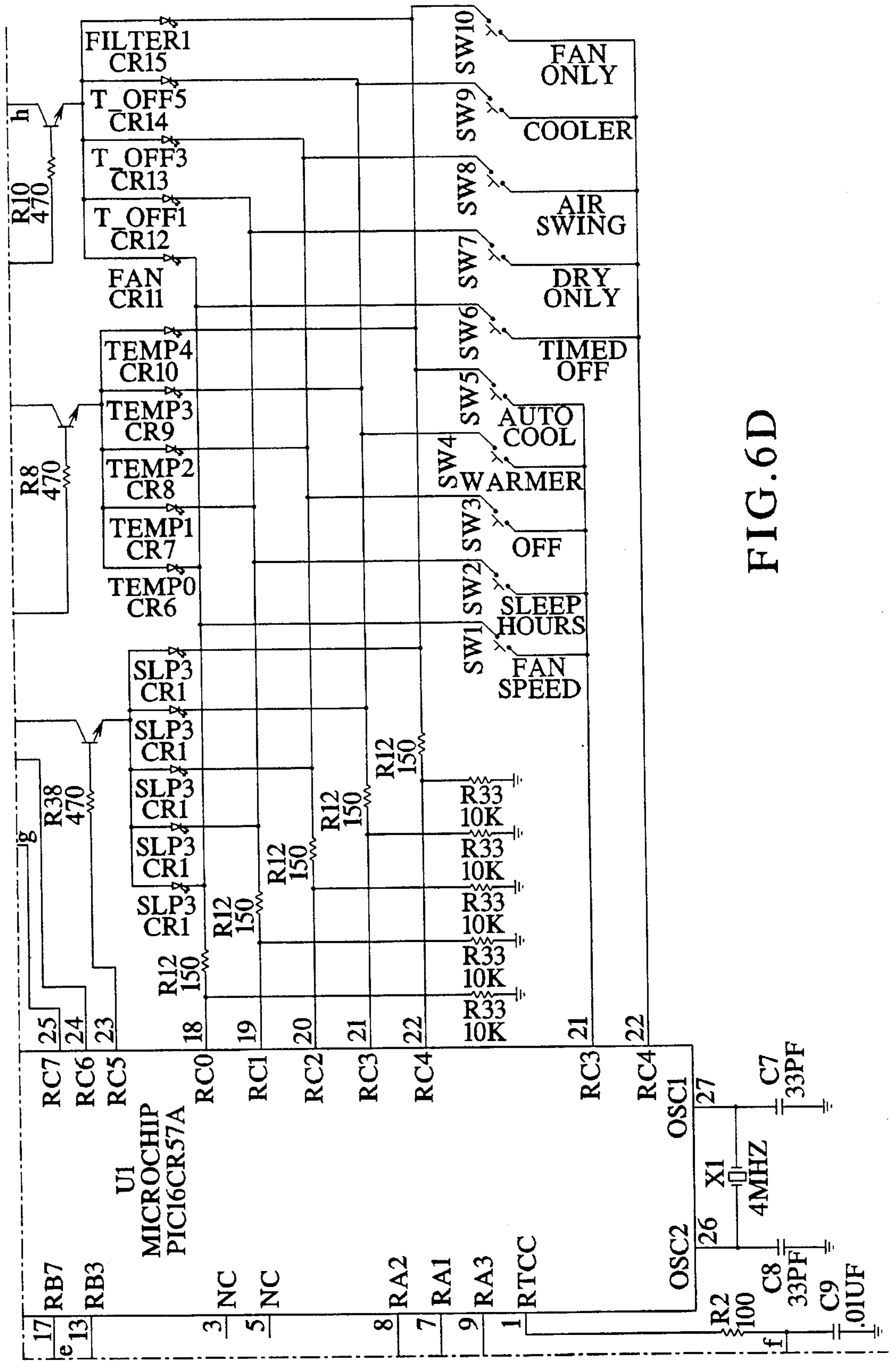
Figure 7:
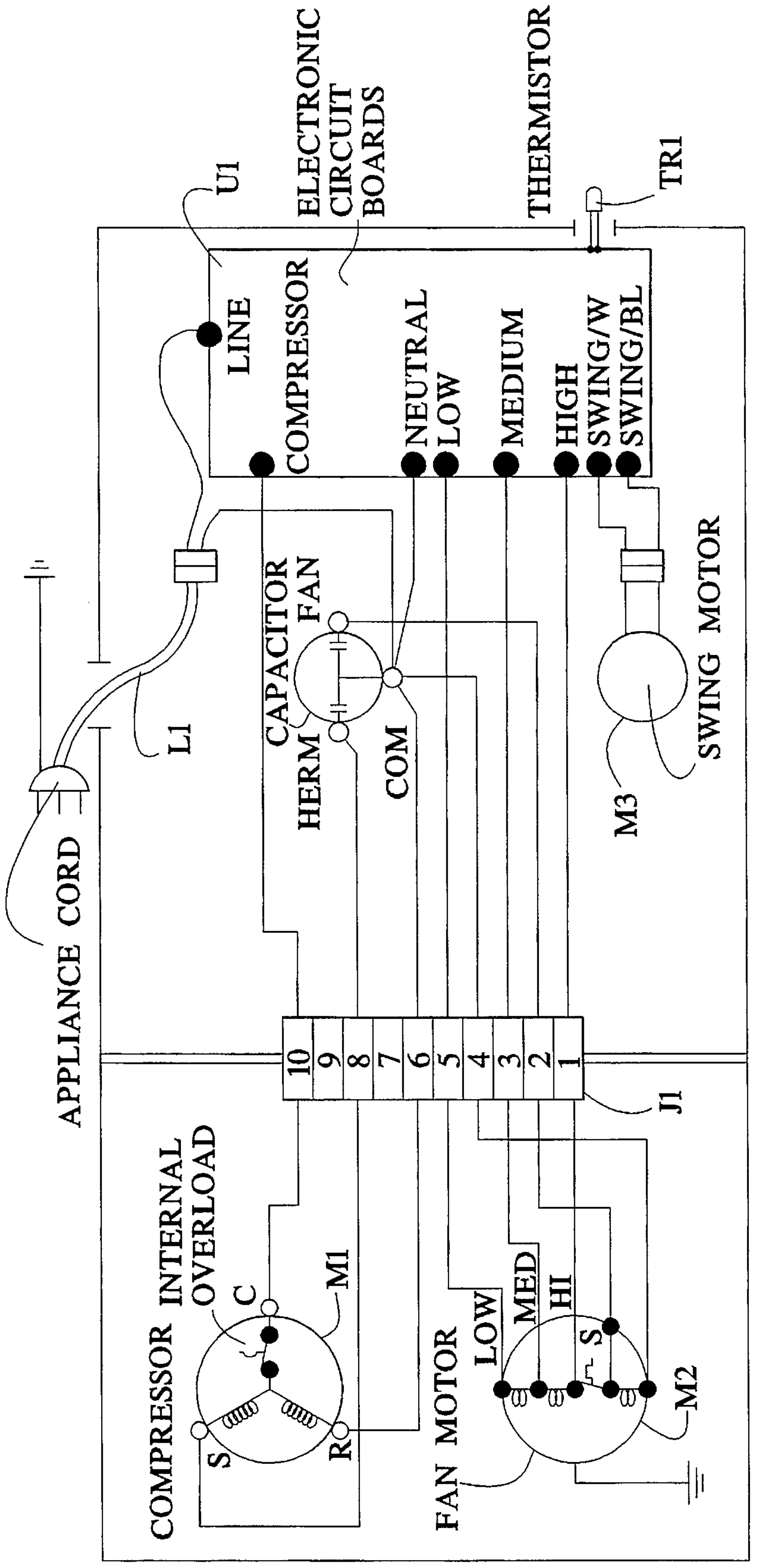
FIG. 7 illustrates a schematic of an electrical system of an air conditioner that can embody one or more of the inventions described herein.

In FIGS. 6A–6D, there is illustrated a controller that is configured to operate the air conditioner 10 in various modes or cycles and to accept as inputs the signals from at least the two different types of remotes 70 and 100 briefly descried above. In conjunction therewith, FIG. 7 illustrates the overall electrical system of the air conditioner 10 and should be considered jointly with FIG. 6. FIG. 5 illustrates how the various portions of FIGS. 6A–6D are related to each other.

As illustrated, the controller includes a microprocessor unit U1 electronically coupled to various input and output devices so as to control operation of the air conditioner 10. The power for the processor and the various elements coupled to it is provided by means of a power supply PS including the transformer T1 associated with rectifying circuits comprised of diodes D1, D2, D3 and D4 to generate a suitable DC voltage. The power supply is connected to a suitable AC line voltage by means of terminals P2 and P3. In that regard, the power supply PS is configured to convert either 115 V or 220/240 V AC input power at 50 or 60 Hz to the DC voltages suitable for the electronic controller. For that purpose, should the input power comprise 115 V AC, the illustrated jumpers J1 and J3 are kept in place while the jumper J2 is disconnected, but should the input power comprise 220/240 V AC, jumpers J1 and J3 are removed or disconnected, and the jumper J2 is connected.

As further illustrated, the processor U1 is coupled by means of outputs RB6, RB5, RB4, RB7 and RB3 to various relays K1, K2, K3 and K4 and K5 so as to operate a three-speed fan motor M2 at various speeds ranging from "high" to "medium" to "low," to operate a compressor motor M1 and to operate a swing drive motor M3, which drives vertical louvers (not illustrated) so as to swing the vertical louvers from left to right in a manner known already in the prior art. The specific interconnection for operating the various motors M1, M2 and M3 and other devices coupled to the controller U1, is not of particular concern to the inventions described herein. Accordingly, a detailed description is not provided. Further, it is considered that the illustrations provided by FIGS. 6A–6D and 7 sufficiently describe these interconnections to those of ordinary skill in the relevant art.

It is noted, however, that the various connections are provided for driving the fan motor M2 at various speeds, and connections are provided for driving the swing drive motor M3.

Importantly, there is coupled to the processor U1 an infrared signal receiver U2 as part of the sensor unit 26. It is by means of this infrared signal receiver U2 that the signals from either the remote 70 described in connection with FIG. 3 or the remote 100 described in connection with FIG. 4 can be received. Below there is also described a further remote sensor transmitter that also communicates the processor U1 by means of this infrared signal receiver U2.

Additionally, also coupled to the processor U1 are the various switches associated with the buttons on the control panel 24, namely a FAN SPEED switch SW1, a SLEEP HOURS switch, SW2, an OFF switch SW3, a WARMER switch SW4, an AUTO COOL switch SW5, a TIMED OFF switch SW6, a DRY ONLY switch SW7, an AIR SWING switch SW8, a COOLER switch SW9 and a FAN ONLY switch SW10. The various light emitting diodes associated with the various indicators described above are also illustrated, particularly, in FIG. *6d*. There can be seen that a diode CR1 is provided for indicating the three-hour SLEEP HOURS cycle, a diode CR2 is provided for indicating the five-hour SLEEP HOURS cycle, a diode CR3 is provided for indicating the eight-hour SLEEP HOURS cycle, a diode CR4 for indicating that the AUTO CYCLE mode has been selected and a diode CR5 is provided for indicating that the DRY CYCLE has been selected. Light emitting diodes CR6 through CR10 are provided for indicating an increase or decrease in the temperature set point in connection with the indicator 27, as described above. Further, a diode CR11 is provided for indicating that the FAN ONLY cycle has been selected, a diode CR12 is provided for indicating that the TIMED OFF cycle of one hour is selected, a diode CR13 is provided for indicating that the TIMED OFF cycle of three hours is selected and a diode CR14 is provided for indicating that the TIMED OFF cycle of five hours has been selected. Diode CR15 is provided for generating the CHECK FILTER indication.

The manner in which these various switches and diodes are coupled to the processor U1 and are operated in conjunction therewith are well known in the art and further details are not provided herein, except to the extent that programming of the processor U1 provides for differences between the art and the present inventions.

In FIG. 7, of particular note is the inclusion of a thermistor TR1 coupled to the processor U1. This thermistor is provided for measuring air temperature adjacent the air conditioner 10 so that when the air conditioner 10 is operated, for example, in an automatic cycle of operation, the air conditioner 10 can be driven to achieve a temperature substantially equal to a temperature set point. This generic type of operation, of course, is well known.

Figure 8:
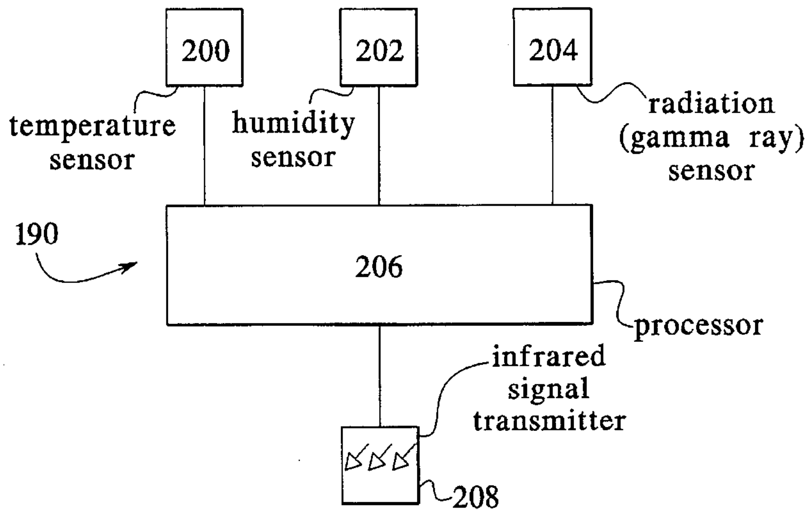
FIG. 8 illustrates a schematic of a remote sensor used in connection with a control system embodying one or more of the inventions herein.

In FIG. 8, there is illustrated a remote sensor unit 190 that can be used to provide a remote sensing to the air conditioner 10. In that regard, the remote sensor unit 190 includes a temperature sensor 200, a humidity sensor 202 and a sunlight radiation sensor 204. Signals from the sensors 200, 202 and 204 are coupled to a remote processor 206 that then preferably converts those signals into a signal suitable for wireless transmission via an infrared signal transmitter 208 to be transmitted to the controller U1 via the infrared receiver U2. Preferably, the signal transmitted by the infrared signal transmitter 208 includes information concerning a remotely sensed temperature as well as what is referred to herein as an adjustment factor, an apparent temperature adjustment factor, or an apparent climate parameter adjustment factor. As is well known, high humidity or great sunlight radiation can affect a person's perception of temperature such that merely measuring temperature does not accurately reflect the comfort level of the environment in a given space. For example, too much sunlight on a person can make them feel much warmer than the temperature really would indicate. Similarly, too much humidity can affect the comfort level of a person in the room in that a highly humid, cold room will seem colder and a hot and humid room will seem hotter. These effects are well known and are not further elaborated herein except to the extent necessary to explain the inventions herein. Accordingly, the signal generated by the processor 206 preferably includes a remotely sensed temperature value as well as an adjustment factor, for example, an apparent increase in the temperature or an apparent decrease in the temperature in view of the sensed humidity and sensed sunlight radiation, so that when the value for the remotely sensed temperature is processed, an adjustment factor can be taken into consideration to compensate for the apparent over-valuing or under-valuing of the temperature comfort level in the space.

Wind chill or movement (or activity) in the room (or enclosed space) being conditioned could also be taken into consideration should a suitable and cost effective sensor be developed.

An example of another appliance system that employs a remotely sensed temperature is disclosed in U.S. Pat. No. 5,321,229, the disclosure of which is fully incorporated herein by reference.

Of course, the processing provided by the processor 206 in arriving at the adjustment factor could be performed by the processor U1. In that regard, the processor 206 will then merely process the signals generated by the sensors 200, 202 and 204 so as to put them in suitable form for transmission via the infrared signal transmitter 208 and the processor U1 in the air conditioner 10 to perform all of the necessary calculations to arrive at the adjustment factor. Preferably, however, this processing is done by the processor 206 so as to minimize the amount of processing burden placed on the processor U1.

One invention herein comprises the processing of the remotely sensed temperature information and the adjustment factor information by the controller of the air conditioner 10. Preferably, the value of the remotely sensed temperature and a value of the temperature sensed by the thermistor TR1 are averaged and then the adjustment factor is added thereto to arrive at a composite temperature value (preferably in the form of a digital signal or value, but which conceivably could be an analog signal) which is then used by the controller in determining whether the air conditioner has cooled or warmed the room to the temperature set point. It can be appreciated that for the reasons stated above, the use of the adjustment factor from the remote sensor unit 190 can provide more comfort to an individual because the factors of at least humidity and sunlight are taken into consideration. Further, temperature readings covering a larger spatial area are taken into consideration and this means that the air conditioner 10 is operated in response to conditioning of the larger area rather than an area adjacent the air conditioner 10.

Figure 9:
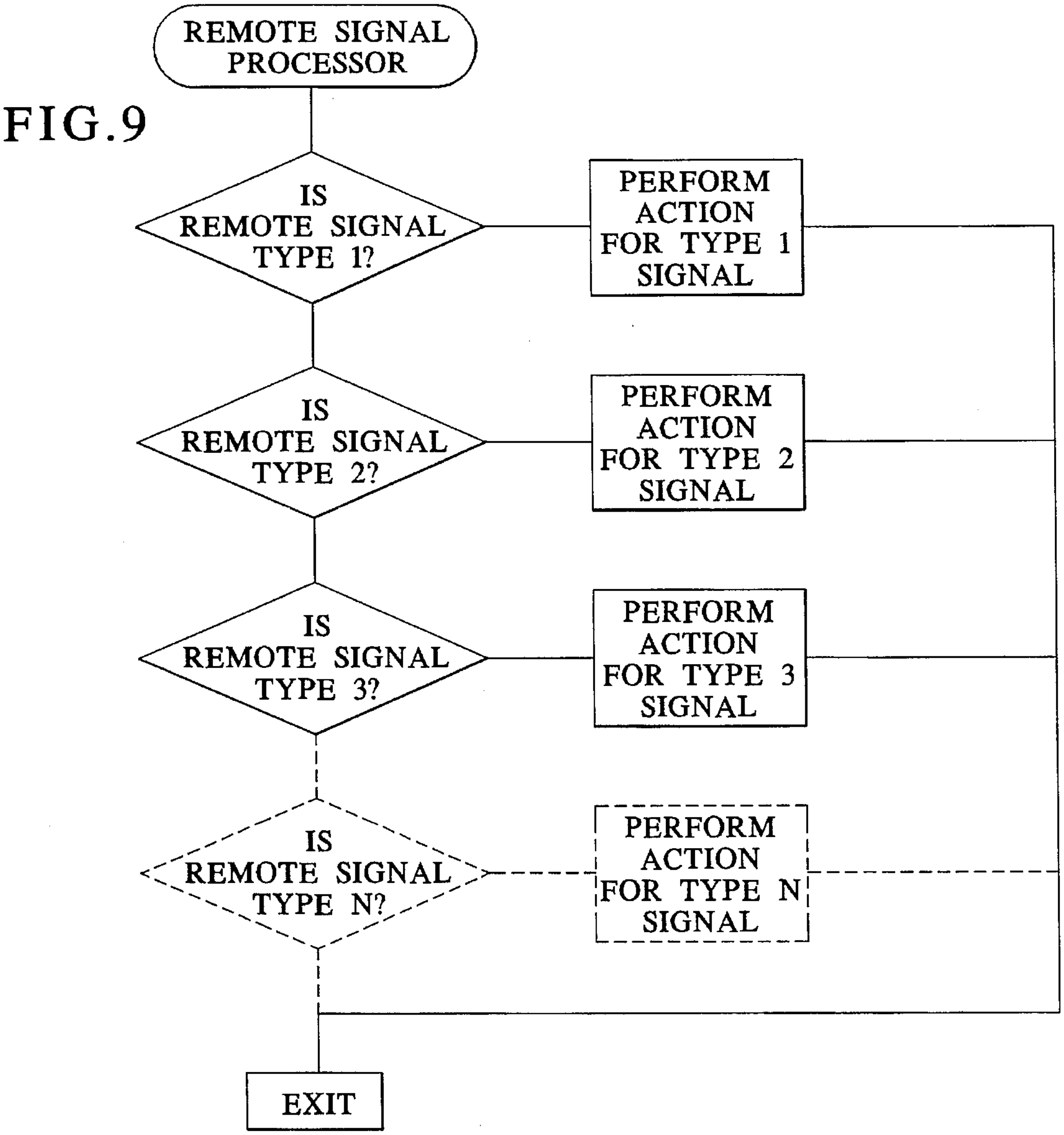
FIG. 9 illustrates a flow chart of one embodiment of one of the inventions described herein.

In FIG. 9, there is provided a flow chart that illustrates the concept behind another invention wherein the controller for the air conditioner 10 is configured for accepting and processing signals having different protocols from different remotes. In the presently preferred embodiment, the various remotes that would be sending signals having different protocols include the hand-held remote 70 of FIG. 3, the credit card type remote 100 of FIG. 4 and the sensor unit 190 of FIG. 8. The protocols of these various remotes differ in the type of information sent and in the configuration of that information, although in an overall scheme the signals are similar.

In that regard, the various remote transmitters 70, 100 and 190 transmit a signal that is received by the air conditioner 10 that includes three general portions, a remote identifier, useful data and a checksum. The remote identifier information preferably includes an indication that the remote is of a manufactured type, preferably Whirlpool Corporation, and of a remote type such as type 1, type 2 or type 3. Following the remote identifier portion is the useful data portion. It is this portion that differs between the various units. Following the useful data portion is a checksum, which is utilized to verify the information transmitted.

The remote identifier and checksum each comprise 1 byte of data. The useful data portion varies in size from 1 byte to 12 bytes. Thus, a buffer capable of holding at least 14 bytes of data is provided in the processor unit U1.

With respect to the remote 100, the useful data portion comprises a keystroke so that when this information is acted upon by the processor U1 of the air conditioner 10, the processor U1 will interpret the information and act upon it as if a keystroke or button had been pushed on the control pad 24.

With respect to the sensor unit 190, the useful data portion transmitted by this unit preferably includes the remotely sensed temperature value as well as the adjustment factor information. Thus, for example, a signal from the sensor unit 190 would include a remote identifier portion comprised of the information, Whirlpool Corporation and a type number different than that for the remote 100, a numeral for the remotely sensed temperature value, a numeral for the adjustment factor, and then the checksum.

With respect to the remote 70, the information provided in the signal transmitted by this remote is fairly extensive. In addition to the unique transmitter identifier, for example, manufacturing information such as Whirlpool Corporation and a transmitter or remote type different than a type chosen or selected for either of the remotes described above, the signal transmitted by the remote 70 includes information regarding what is referred to herein as control state data which generally comprises 1) current real time from the real time clock of the remote 70, 2) a desired state of control, 3) a future state of control, 4) a time for assuming the future state and 5) a time to turn off. A state of control consists of a selected cycle of operation, a temperature set point, a fan speed and a series of feature flags which include the following: auto, fan speed select, louver swing and, in the presently preferred embodiment, a SLEEP HOURS flag. The foregoing information is placed in a known order and preferably occupies about twelve bytes.

It can be appreciated that the exact format for such information can be of any suitable type, and any programmer of ordinary skill should be able to devise a suitable format.

As illustrated in FIG. 9, when a signal is received from a remote transmitter such as in any of the remote 70, the remote 100 or the sensor unit 190, the processor U1 first determines whether the remote signal is of a type compatible with the air conditioner 10 and the type of remote from which the signal was received. This process is illustrated by the various decisions presented in the FIG. 9 wherein the processor 10 determines whether the remote is of signal type 1, signal type 2, signal type 3, or a generic signal type N. If the signal is correctly received and is of a type suitable for the air conditioner 10 as opposed, for example, to a TV remote, then the processor 10 effects the appropriate action for that signal type. In the presently preferred embodiment, if the signal is of a type from the remote 100, then the processor 10 treats the information in the buffer in the processor U1 as a keystroke. If the signal is determined to be from the remote 70, then the processor treats the information in the buffer as representing the foregoing states of control and controls the air conditioner 10 as dictated by these states of control. If the signal is determined to be from the sensor unit 190, then the processor U1 treats the information in the buffer as comprising a temperature value and an adjustment factor.

Figure 10:
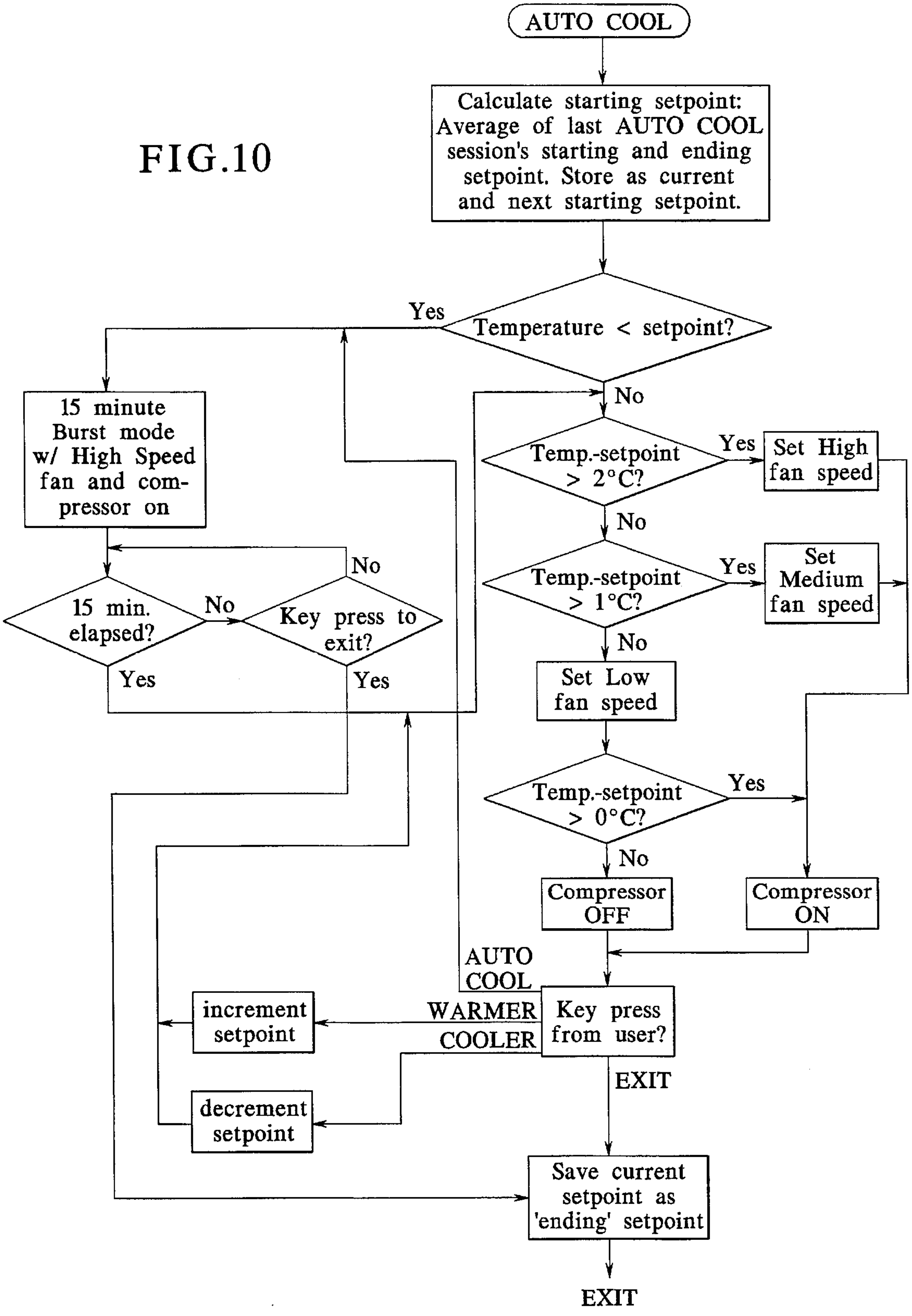
FIG. 10 illustrates a flow chart of a cycle of operation that can be incorporated in a control system embodying one or more of the inventions herein.

In FIG. 10, there is provided a flow chart illustrating the concept behind what is referred to herein as an AUTO COOL cycle for the air conditioner 10. In this AUTO COOL cycle or mode of operation, the air conditioner 10 is operated to condition air so as to achieve a sensed temperature equal to a temperature set point by selecting compressor operation and various fan speeds appropriate for the differences between the sensed temperature and the temperature set point. Other automatic cooling cycles of operation are known wherein generally an air conditioner 10 is driven to condition air to a temperature set point by appropriate selection of fan speeds and compressor operation. For example, see U.S. Pat. No. 5,319,942, incorporated herein by reference.

In the presently preferred embodiment of the AUTO COOL cycle or mode of operation, however, if the air conditioner 10 is off and the sensed temperature is less than the temperature set point when the AUTO COOL cycle is selected, the processor U1 is programmed to energize the fan at a high speed and to turn the compressor on to provide maximum cooling. If the air conditioner 10 is off and the sensed temperature is above the temperature set point when the AUTO COOL cycle is selected, the air conditioner is driven in a normal automatic cooling cycle of operation, e.g., as set forth in the above-referenced U.S. Pat. No. 5,319,942, wherein a fan speed is selected by the processor U1. Further, if the air conditioner 10 already is in an AUTO COOL cycle and the AUTO COOL button is depressed, the air conditioner 10 will again be driven in a maximum cooling mode as just described.

Importantly, in the AUTO COOL cycle operation, the processor U1 is programmed to "learn" a user's temperature preferences. This temperature preference is then utilized on subsequent AUTO COOL cycles as will be explained below. When the AUTO COOL cycle is selected, the unit initially cools the room for fifteen minutes before allowing the room to rise to a pre-learned temperature. In that regard, although the air conditioner 10 has an initial factory preset AUTO COOL cycle cooling temperature set point, the user may decide that the room is too warm or cool when this factory preset temperature set point is utilized. Accordingly, a user may change the temperature by pressing either the WARMER button 28 or the COOLER button 30 described above. When the temperature set point is changed, the processor U1 memorizes these changes and "learns" what conditions make the user most comfortable.

Similarly, a user may modify the fan speed while the air conditioner 10 is in the AUTO COOL cycle of operation by pressing the FAN SPEED button 40 described above. As described above, each press of the FAN SPEED button 40 advances the fan speed through the cycle high to medium to low and then back to high so that a user presses the FAN SPEED button 40 to a desired fan speed is reached.

Additionally, the AIR SWING feature described above can be selected by a user during the AUTO COOL cycle of operation by pressing the AIR SWING button 42.

Again, as illustrated in FIG. 10, if the AUTO COOL cycle key is pressed following the initial fifteen-minute burst of cooling air, the burst will again be re-initiated. At this point, it is assumed that a user has pressed the AUTO COOL cycle with the expectation that such a burst will occur and that this is done because the user is uncomfortable with the present temperature.

In the learning process of the AUTO COOL cycle, the initial or entry temperature set point is a function of the last starting (or entry) and ending temperature set points, which, of course, must have been memorized as described above. Preferably, the starting set point for an AUTO COOL cycle of operation is an average, with an integer round-off, of the last starting and ending set points. The integer round-off forces a starting set point to change only if a 1° C. change occurred between the last starting and ending set points. In this manner, a user preferred temperature can be repeated.

As described above, the AUTO COOL cycle automatically selects a fan speed. The fan speed is chosen to provide low noise levels when minimal cooling is required, i.e., the temperature is near or below the temperature set point. Since the temperature is significantly above the temperature set point, a high fan speed is chosen to maximize cooling. Preferably, the cutoff point between the selection of a high fan speed and a medium fan speed could be 2° while the choice between a medium fan speed and a low fan speed could be 1° C.

In FIGS. 11 to 16, there is illustrated another cycle of operation for the air conditioner 10. This cycle of operation is referred to herein as the SLEEP HOURS cycle and preferably is utilized while a user is sleeping.

Figure 11:
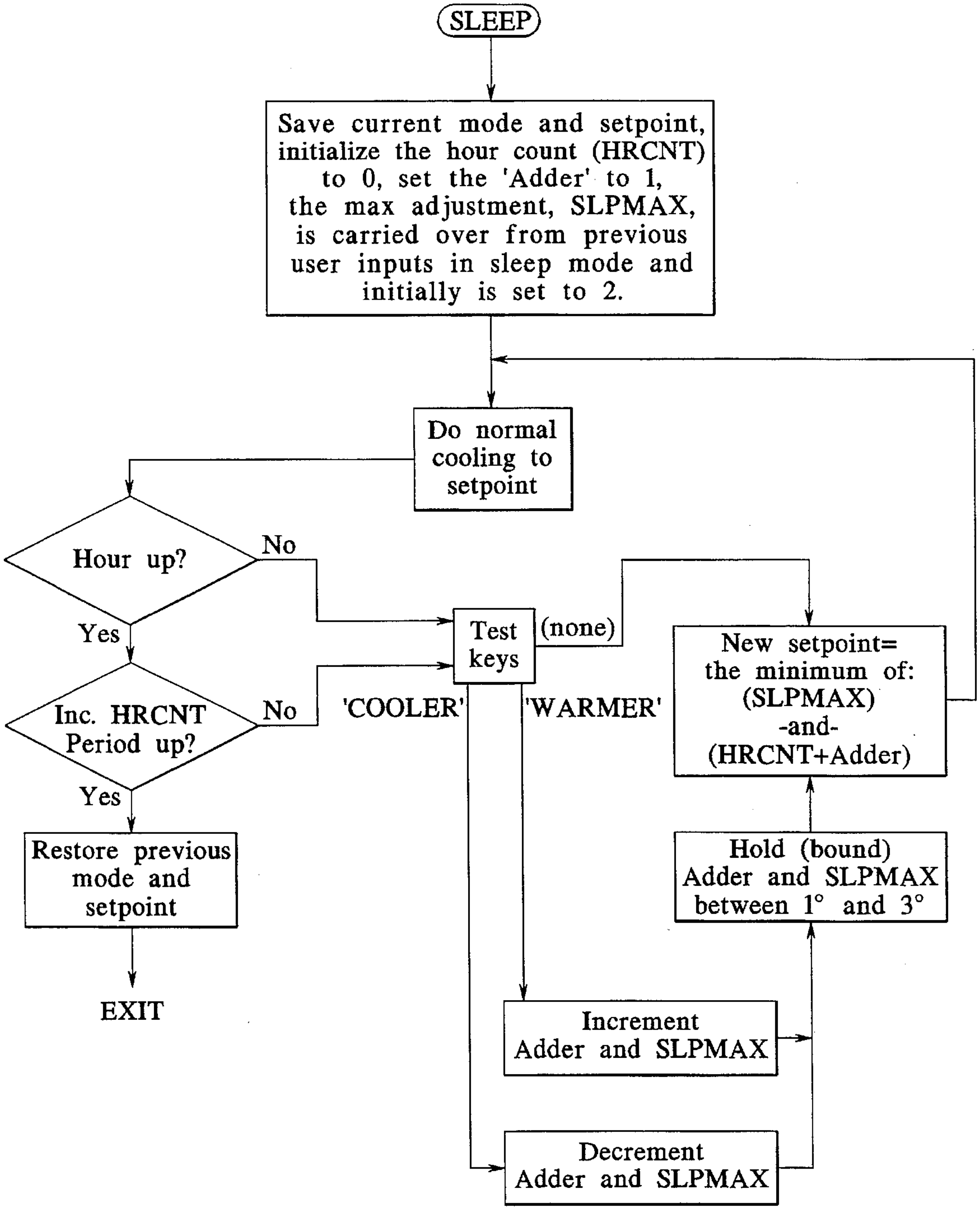
FIG. 11 illustrates the flow chart of another cycle of operation that can be incorporated in a control system embodying one or more the inventions herein.

In this SLEEP HOURS cycle of operation, the air conditioner 10, or more precisely the processor U1, "learns" the total temperature adjustment necessary over a sleep period to produce comfortable sleeping conditions for the user. In that regard, the temperature set point utilized by the processor U1 is varied during the SLEEP HOURS cycle by a predetermined amount. Preferably, the temperature set point is gradually increased over the cycle period to maintain comfort to the body as sleep is entered and deepens. However, adjustments by the user to the temperature set point will alter the total amount of temperature change over the cycle. For instance, if the WARMER button 28 is depressed, the temperature set point will increase and allow the total temperature change, from start of the cycle to the end, to increase as well. Importantly, this adjustment to the cycle, if great enough, will be performed on succeeding SLEEP HOURS cycles until changed by a further adjustment. The concept of the SLEEP HOURS cycle of operation is illustrated in FIG. 11. The patterns of the change in set point and room temperature are illustrated in FIGS. 12 to 16.

Figure 12:
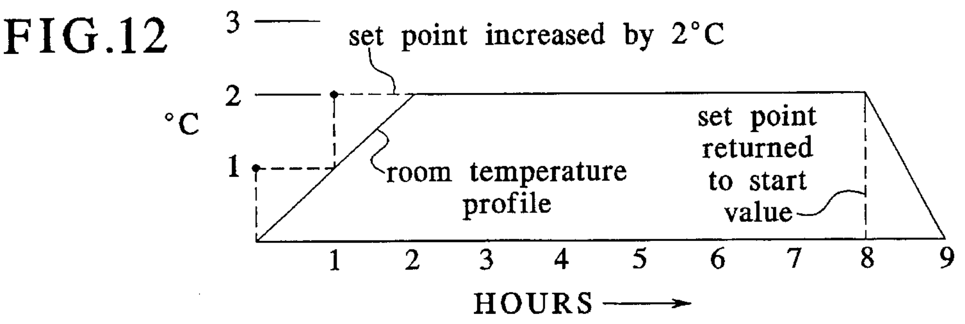
FIG. 12 illustrates a set point/room temperature relationship that can occur during operation of the cycle illustrated in FIG. 11.

In FIG. 12 a preferred factory default operation pattern is illustrated. As can be seen, during the first two hours of the cycle, the temperature set point itself is changed incrementally in 1° C. increments by 2° C. As further illustrated, the room temperature is allowed to rise to the set point over that two hour time period. At the end of the cycle, the set point is returned back to the starting set point and room temperature returns to the cooler temperature.

Figure 13:
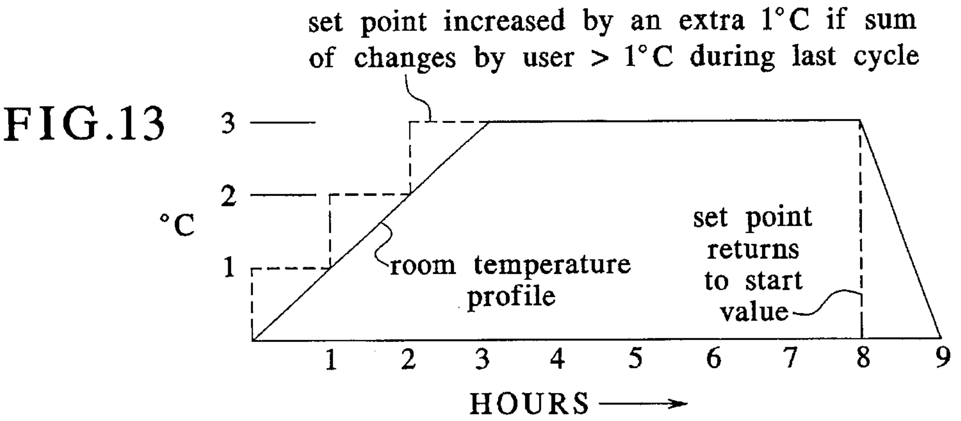
FIG. 13 illustrates another set point/room temperature relationship that can occur during operation of the cycle illustrated in FIG. 11.

In FIG. 13, it is illustrated that if the temperature was increased by than one degree Celsius during the previous SLEEP HOURS cycle, but not during the current cycle of operation, a different profile results wherein the temperature set point increases by 3° as opposed to just the usual 2° C. This 3° change in temperature set point preferably occurs over a three hour time period.

Figure 14:
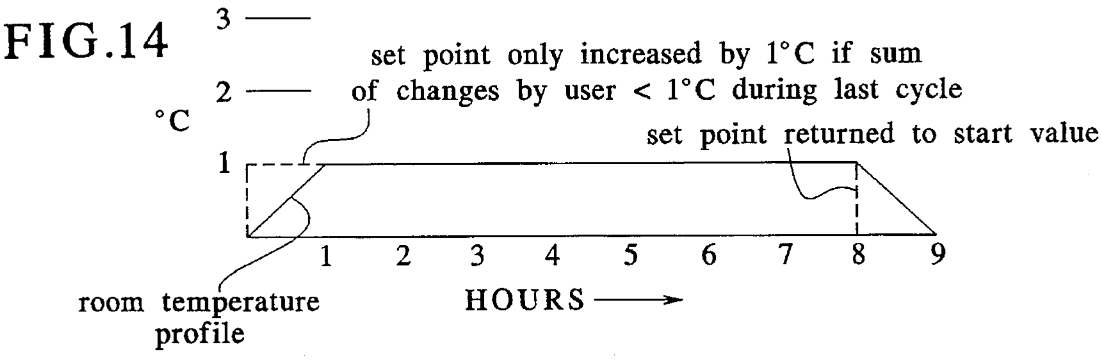
FIG. 14 illustrates another set point/room temperature relationship that can occur during operation of the cycle illustrated in FIG. 11.

In FIG. 14, it is illustrated that if the temperature was decreased by a user by more than one degree Celsius during the previous SLEEP HOURS cycle, but not during the current cycle of operation, a different profile results wherein the temperature set point increases by only 2° C. This 1° change in temperature set point preferably occurs over the first hour of the cycle.

Figure 15:
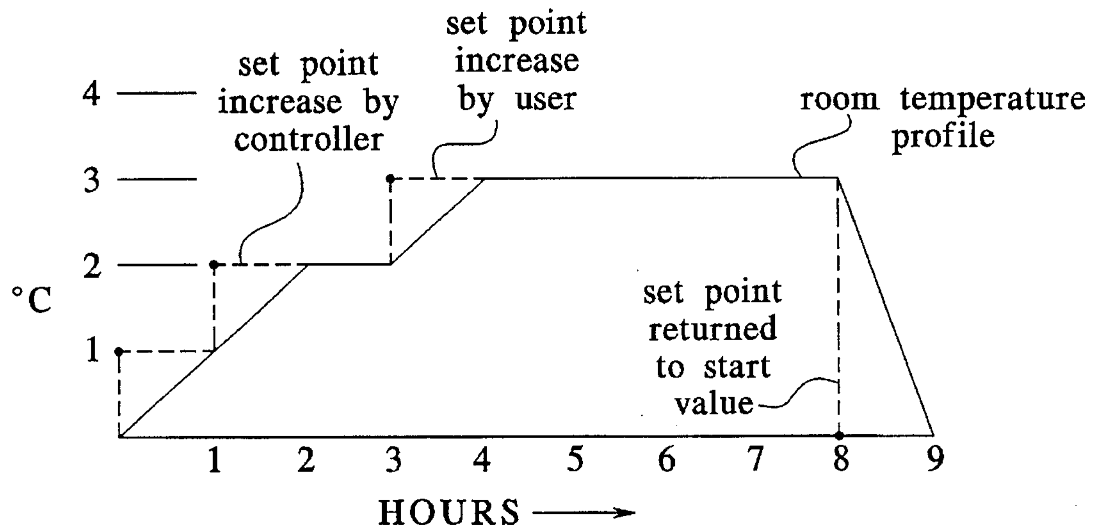
FIG. 15 illustrates another set point/room temperature relationship that can occur during operation of the cycle illustrated in FIG. 11.
Figure 16:
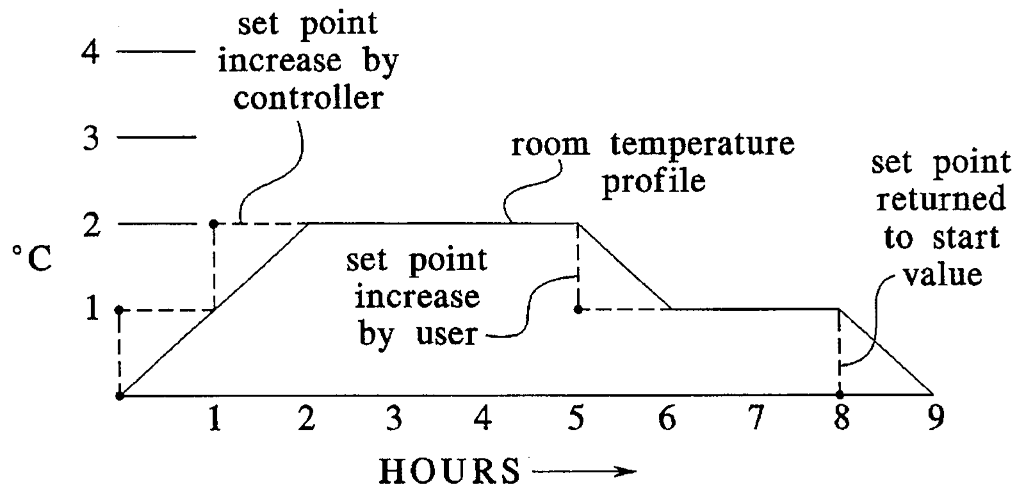
FIG. 16 illustrates another set point/room temperature relationship that can occur during operation of the cycle illustrated in FIG. 11.

In FIGS. 15 and 16, some possible patterns that could occur during a night's sleep are also illustrated. In FIG. 15, it is illustrated what would actually occur if the user were to change the set point upwardly by only 1° C. and in FIG. 16 it is illustrated what would happen if the user were to change the set point lower manually by only 1° C.

In one presently preferred embodiment of the invention, the processor U1 is configured so that the SLEEP HOURS cycle of operation can be activated from any condition and it will turn to that condition upon conclusion. This configuration offers the user significantly increased flexibility over other "sleeping time" cycles that can only be activated from an automatic cooling mode.

As set forth just above, during the SLEEP HOURS cycle of operation the processor will adapt the temperature set point used of the last cycle utilizing a set point that was executed. For example, if the last cycle that was executed that used a set point was an AUTO COOL cycle, then the last AUTO COOL cycle ending set point would be utilized as the initial SLEEP HOURS cycle temperature set point. Thus, for example, if the air conditioner 10 was operated first in an AUTO COOL cycle, then turned off, then turned on for a SLEEP HOURS cycle of operation, in this presently preferred embodiment, the ending temperature set point of the AUTO COOL cycle of operation would be utilized as the starting temperature set point for the SLEEP HOURS cycle of operation and upon conclusion of the SLEEP HOURS cycle of operation, the air conditioner unit would be turned OFF as that was the condition of the air conditioner was in when the SLEEP HOURS cycle of operation was selected.

With reference now to FIGS. 17 to 22D wherein the remote control unit 70 and operation thereof is illustrated in greater detail, a more detailed description of the remote control unit 70 is presented. In FIGS. 17 to 19, the nature of the housing of the remote control unit 70 is illustrated. In FIGS. 21A to 21D, the circuitry contained within the housing is illustrated.

As can be seen in FIGS. 17 to 19, the remote control unit 70 includes a housing 1000 with functional attributes to be described next and that has orthogonal longitudinal lateral dimensions. Essentially, the housing 1000 includes a top side 1002 and a bottom side 1004 with a periphery 1006 extending therebetween. Longitudinal ends 1008 and 1010 of the housing 1000 are rounded so that the housing 1000 has a profile that is substantially oblong along the longitudinal dimension, when viewed from the top or bottom side.

The housing 1000, portions and features of which are discussed next, preferably is molded from a suitable plastic so that corners are rounded and not sharp. This also enhances a user's ability to grasp the unit 70 as a given grip will extend further around the unit 70 with rounded corners rather than rectangular corners.

As illustrated, the longitudinal end 1008, which is positioned above the display section 72, incorporates therein a transparent portion 1012 which serves as a window for an infrared transmitter mentioned below and illustrated in FIG. 21D.

As further illustrated, the periphery 1006 is substantially split in half so that the housing 1000 essentially splits into a top, half 1014 and a bottom half 1016 which can be separated for mounting of the circuitry of FIGS. 20A to 20D.

With respect to the bottom side 1004, this is illustrated best in FIGS. 17 and 18 wherein it can be seen that the bottom side 1004 incorporates a gripping portion 1020 and a battery portion 1022. The battery portion 1022 includes a battery door 1024 that preferably is slidably engaged on the longitudinal end 1010 so that it can be easily removed for insertion of batteries 1025 within an appropriate battery receptacle 1026 molded into the bottom half 1016.

Inventively, the gripping portion 1020 of the bottom side 1004 incorporates two contoured recesses or depressions 1030 and 1032 which extend from opposite lateral sides of the periphery 1006 so as to form two concavities in the bottom side 1004. This in turn produces a contoured rib 1034 that extends centrally along the longitudinal length of the gripping portion 1020. This molding of the longitudinal rib 1034 creates a substantially figure 8 or hour glass configuration on the bottom side 1004 comprising two supporting pads 1036 and 1038 and the rib 1034 extending therebetween.

Each of the supporting pads 1036 and 1038 provides support for the remote control unit at at least two laterally spaced apart positions so that the remote control unit 70 can be stably supported on a flat or planar surface. Preferably, as illustrated, the pads 1036 and 1038 themselves comprise planar surfaces so as to provide maximum support for the remote control unit 70 on a planar surface. Further, preferably, the bottom half 1016 is a molded member so that the rib 1034 and pads 1036 and 1038 are formed to exhibit a continuous planar surface having the overall figure 8 or hour glass configuration mentioned above.

It can be appreciated that with this configuration of the bottom side 1004, the remote control unit 70 can be easily gripped by a user because the concavities 1030 and 1032 provide a space between a surface on which the remote control unit 70 would lie and the periphery 1006 so that fingers can easily slide between the surface and periphery 1006 for grasping of the remote control unit 70. Once the tip of a finger is inserted into one of the spaces, the smooth surface of the concavity will act as a camming surface and the unit 70 will be caused to ride up the finger, thereby lifting the unit 70 from the surface. As the unit 70 is lifted, the user can continue to insert their finger under the unit 70 to fully grasp the unit 70.

Moreover, the pads 1036 and 1038 provide a wide surface contact between the remote control unit 70 and any flat surface on which the remote is placed so that a remote 70 is held in a stable flat position relative to the surface. It can be appreciated that with the stable support provided by the pads 1036 and 1038, the control buttons or keys 74 on the top side 1002 of the remote control unit 70 can be spaced more widely apart, and nearer to the periphery 1006 of the remote control unit 70 and depressed without causing tipping of the remote control unit 70.

Further, the rib 1034 provides rigidity and strength to the bottom side 1004 so that damage to the remote control unit 70 is minimized should excessive weight be placed on the top side 1002 of the remote control unit 70, for example, by way of heavy objects or stepping thereon.

In FIGS. 20A to 20M, the operation of the remote control unit 70 is illustrated in greater detail.

Figure 20A:
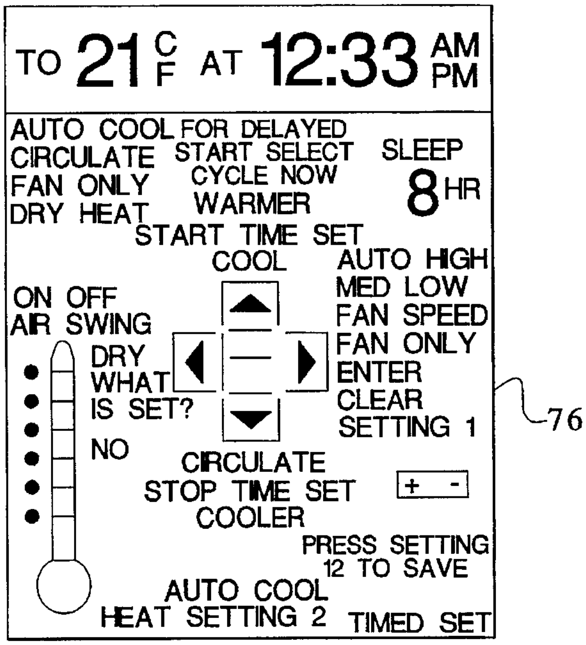
FIGS. 20A to 20M illustrate various displays that can result in the display element of the remote control unit of FIG. 3 during use of the remote control unit.

In FIG. 20A, all of the labels and icons displayable on the display element 76 are illustrated. As illustrated, the remote control unit 70 preferably is programmed to be capable of displaying one or more of the following on the display element 76, depending on keystrokes entered by a user via the control buttons 74:

- an "AUTO COOL" label which when displayed indicates that the remote control unit 70 is in a mode for accepting AUTO COOL commands or keystrokes;
- a "FOR DELAYED START SELECT CYCLE NOW" label which when displayed provides an instruction to the user to select an operating cycle that utilizes a delayed start (for example, a delayed cooling cycle);
- a "SLEEP HOUR" label with accompanying selected sleep hour cycle length in hours that is displayed when the user is entering commands or keystrokes relevant to a sleep hour cycle;
- a "CIRCULATE" label that is displayed to indicate that an air recirculation feature has been selected for the air conditioner 10;
- a "FAN ONLY" label that is displayed to indicate that a fan only cycle of operation has been selected;
- a "DRY" label that is displayed to indicate that the DRY cycle (discussed above) has been selected;
- a "HEAT" label that is displayed to indicate that a heating cycle (on heat pumps) has been selected;
- a "WARMER" label that is displayed to indicate that an arrow is associated with a WARMER button function, i.e., to enable a user to increase a temperature set point;
- "START," "TIME" and "SET" labels that are displayed to indicate that an arrow is associated with a CLOCK SET function, a STOP TIME SET function or a START TIME request function, respectively;
- a "COOL" label that is displayed to indicate that an arrow is associated with a cooling cycle selection;
- an "AIR SWING" label that is displayed to indicate that an arrow is associated with an AIR SWING toggling;
- "ON" and "OFF" labels which are displayed to indicate whether the AIR SWING function is toggled on or off;
- a "WHAT IS SET?" label that is displayed to indicate that an arrow is associated with a function that will cause the remote control unit 70 to display on the display element 76 those modes that are set;
- a "FAN SPEED" label that is displayed to indicate that an arrow is associated with a fan speed selection function;
- "AUTO", "HIGH", "MEDIUM" and "LOW" labels that are selectively displayed to indicate the fan speed that is selected;
- a "FAN ONLY" label that is displayed to associate an arrow with a FAN ONLY selection function;
- an "ENTER" label that is displayed to indicate that an arrow is associated with an enter function or keystroke;
- a "CLEAR" label that is displayed to indicate that an arrow is associated with a function for clearing a timed setting;
- a "CIRCULATE" label that is displayed to indicate that an arrow is associated with an air recirculation selection function;
- "STOP TIME" and "SET" labels that are displayed to indicate that an arrow is associated with a stop time selection function (this "SET" label is distinct from the earlier "SET" label associated with "START");
- a "COOLER" label that is displayed to indicate that an arrow is associated with a COOLER button or temperature set point decreasing function;
- an "AUTO COOL" label that is displayed to associate the down arrow with an auto cool selection function;
- "SETTING1" and "SETTING2" labels that are displayed to indicate that an arrow is associated with the option of modifying the functions of the SETTING1 and SETTING2 buttons;
- a "PRESS SETTING TO SAVE" label, a "1" label and a "2" label that are displayed appropriately to prompt the user to save SETTING1 or SETTING2, respectively;
- a "HEAT" label that is displayed to indicate when the heat setting mode selection is selected;
- a "TIMED SET" label that is displayed to indicate when a timed set mode has been selected;
- a four-way arrow icon that is displayed to indicate the associations of the various arrow keys with the above-mentioned functions; and
- a thermometer icon that is displayed to indicate increasing or decreasing temperature set points.

Figure 20B:
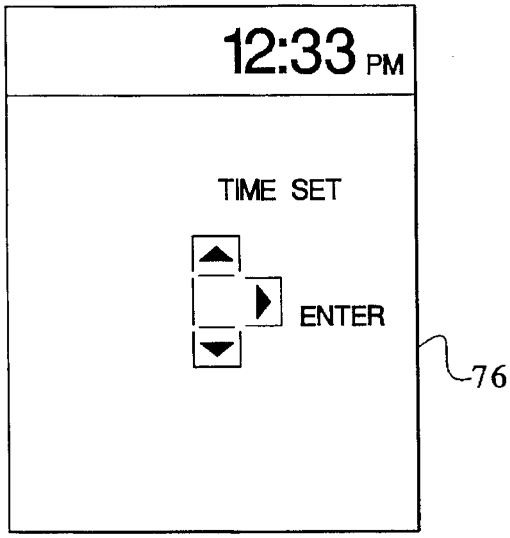

In FIG. 20B, the resulting display on the display element 76 after insertion of the batteries is illustrated. In this state, only three arrows of the four-way arrow icon are displayed (i.e., a three-way arrow icon is displayed) to lead a user through a resetting of the digital clock 78. In this display, the up and down arrows are associated with a TIME SET function selection, while the right arrow is associated with an ENTER function.

Figure 20C:
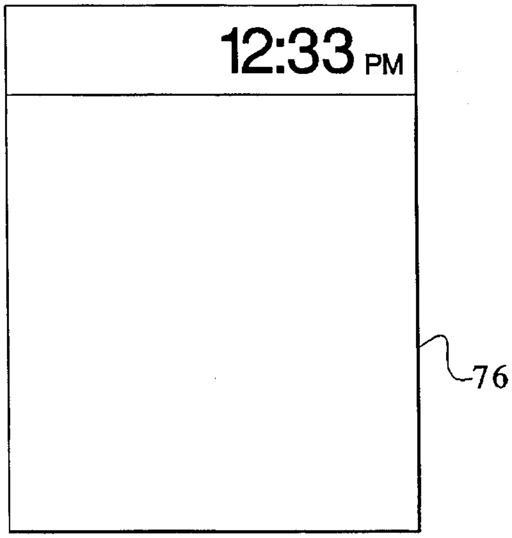

In FIG. 20C, the display element 76 is illustrated as it would appear when the remote control unit 70 is in an OFF state, i.e., after the OFF button 90 has been pressed. In this state, the remote control unit 70 will maintain a real time, as set just after insertion of the batteries. However, because no user selections are to be made, no display is necessary.

Figure 20D:
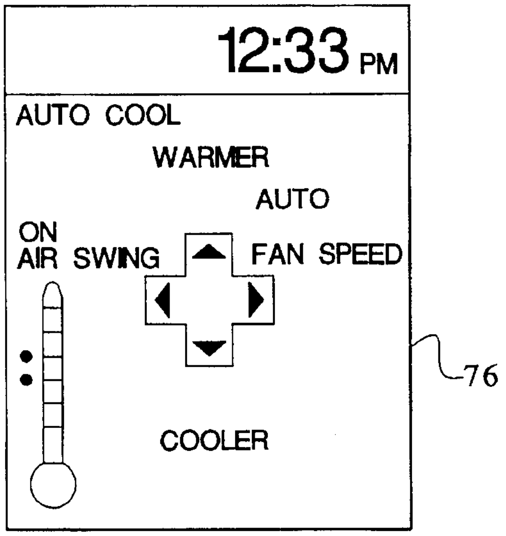

In FIG. 20D, the display presented on the display element 76 after depressing of the AUTO COOL button 88 is illustrated. Therein it can be seen that a simulation of the temperature display 27, i.e., the thermometer icon, is presented on the left-hand side of the display element 76 and the four-arrow icon is also displayed with labels indicating the various functions assigned to the four arrows of the arrow key 82. In this example, the up arrow key functions as a WARMER button in a manner to the WARMER button 28 of the main control. Conversely, the down arrow is associated with the COOLER function of the COOLER button 30. The right arrow is associated with the fan speed selection function as provided by the FAN SPEED button 40. The left arrow is associated with the air swing toggling function of the AIR SWING button 42. In the top, left-hand corner of the display is provided the label "AUTO COOL" to indicate to a user that the AUTO COOL programming function is in effect for the remote 70.

Figure 20E:
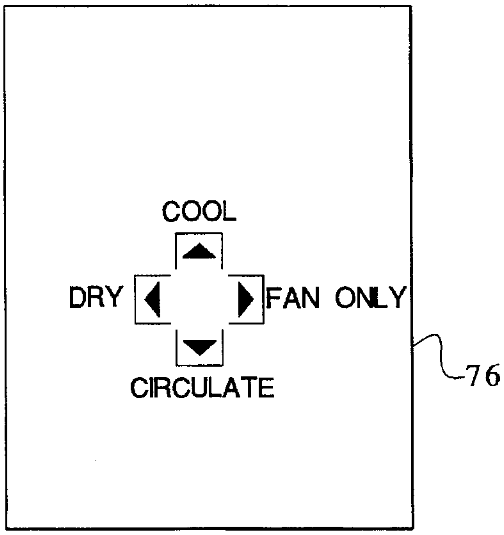

In FIG. 20E, the resulting display on the display element 76 after pressing of the MENU button 80 is illustrated. Therein, the four-way arrow icon with four associated functions is displayed. In this illustration, the up arrow is associated with the COOL cycle selection function, while the down arrow is associated with the CIRCULATE function selection. The left arrow is associated with a DRY ONLY function selection, while the right arrow is associated with the FAN ONLY function selection.

Figure 20F:
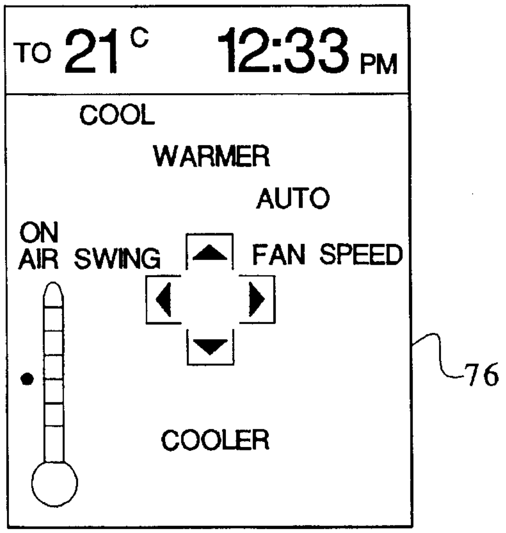

In FIG. 20F, the resulting display on the display element 76 is illustrated after the COOL function has been selected from the menu displayed in FIG. 20E. In the upper left corner of the display, the actual temperature set point is displayed along with the "TO" icon to indicate that this is the temperature to cool the room to. The resulting display includes the thermometer icon that is similar to the simulated thermometer 27 on the main control panel 24 as well as a four-way arrow icon having the up arrow assigned to the WARMER select function, the down arrow associated with the COOLER select function, the right arrow associated with the FAN SPEED selection function, and the left arrow associated with the AIR SWING on/off selection function. At the top, left-hand corner of the display element 76 is presented the label "COOL" to indicate that the COOL function has been selected. Above the label "FAN SPEED" is the label "AUTO" to indicate that the AUTO fan speed (i.e., the main controller will pick a fan speed) has been selected.

Figure 20G:
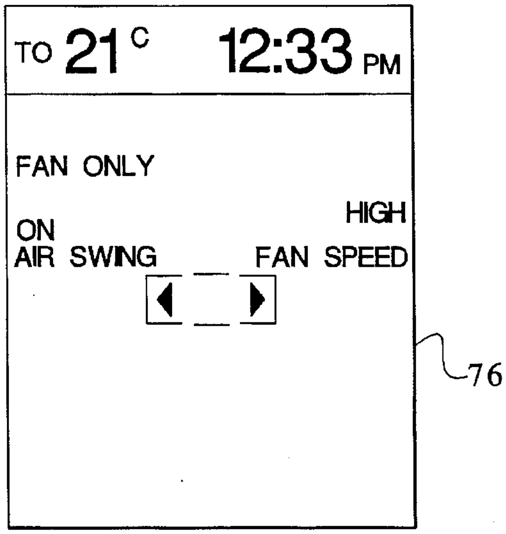

In FIG. 20G, there is illustrated the resulting display on the display element 76 after the FAN ONLY mode has been selected from the menu presented in FIG. 20E. As illustrated, in the top left-hand corner of this figure there is presented the label "FAN ONLY" to indicate that the FAN ONLY mode has been selected. Also presented is a two-way arrow icon having left and right arrows with labels for the associated selectable functions. As illustrated, the left arrow is associated with the AIR SWING on/off function and the right arrow is associated with the FAN SPEED selection function.

Figure 20H:
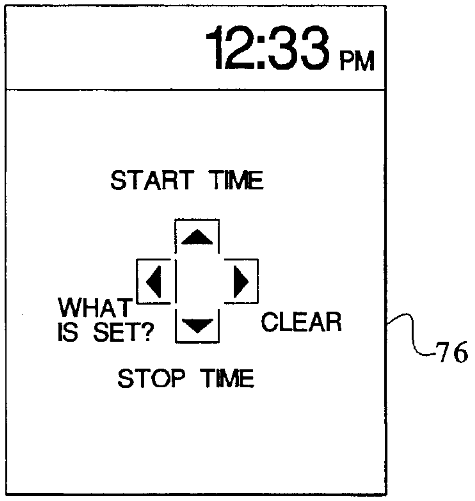

In FIG. 20H, there is illustrated the display resulting on the display element 76 after selection of the TIMED MODE function by appropriate pressing of the TIMED MODE button 86. The resulting display includes the four-way arrow icon having a START TIME selection associated with the up arrow, a STOP TIME selection associated with the down arrow, a CLEAR function associated with the right arrow and a WHAT IS SET? function associated with the left arrow. The START TIME function prompts the user to set a time for the air conditioner to start, then select a cycle, and then, if applicable, to set a temperature. The STOP TIME function prompts the user to set a time for the air conditioner to turn off. The CLEAR function deactivates any START TIME or STOP TIME function previously set. WHAT IS SET? function is a mode in which the remote control unit 70 informs the user what parameters are currently selected for the timed mode.

Figure 20I:
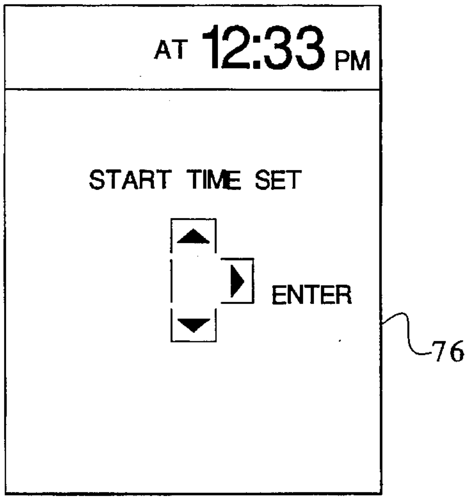

In FIG. 20I, there is illustrated the resulting display after selection of the START TIME function from the display illustrated in FIG. 20H. The resulting display includes a three-way arrow icon having a START TIME SET function associated with the up arrow, and an ENTER function associated with the right arrow.

Figure 20J:
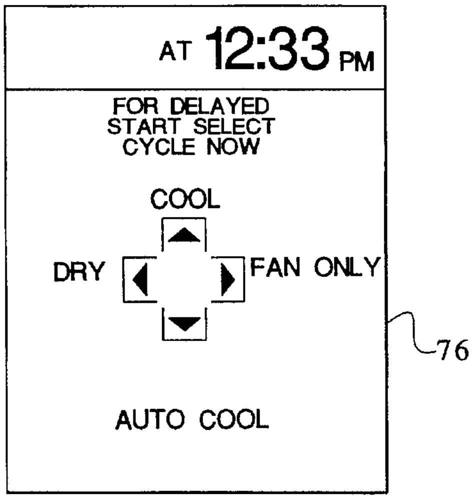

In FIG. 20J, there is illustrated the display resulting on the display element 76 after entering a start time in connection with the display of FIG. 20I. As illustrated, the resulting display includes a COOL function selection associated with the up arrow, an AUTO COOL function selection associated with the down arrow, a FAN ONLY mode selection associated with the right arrow and a DRY cycle mode selection associated with the left arrow. At the top of the display is presented a label providing instructions to the user which states "FOR DELAYED START, SELECT CYCLE NOW" which indicates to the user that for the programmed delayed starting of a timed mode cycle, the cycle should be selected now.

Figure 20K:
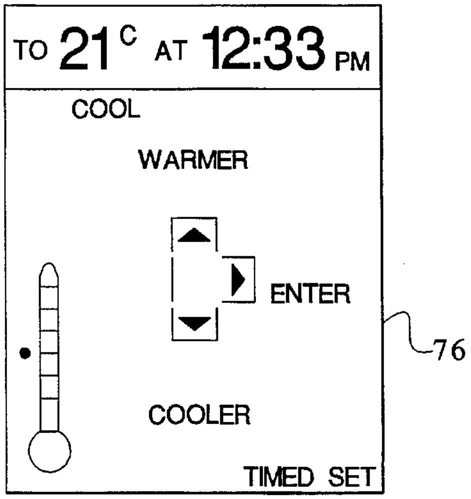

In FIG. 20K, there is illustrated the display resulting on the display element 76 after selection of the COOL mode for a delayed start in conjunction with the display of FIG. 20J. As illustrated, the resulting display includes the actual set point and the simulated thermometer icon indicating temperature set point selection as well as a three-way arrow icon associated with the WARMER, COOLER and an ENTER button functions. The up arrow is associated with the WARMER selection function, while the down arrow is associated with the COOLER selection function and the right arrow is associated with the ENTER function. In the top, left-hand corner of the display is presented the label "COOL" to indicate that a COOL cycle has been selected. In the bottom, right-hand corner of the display is a "TIMED SET" label provided to indicate that the TIMED MODE has been set. After selecting the ENTER function, the display would return to its state prior to the depression of the TIMED MODE key 96 with the exception that the TIMED SET icon would be shown in the lower right corner of the display element 76.

Figure 20L:
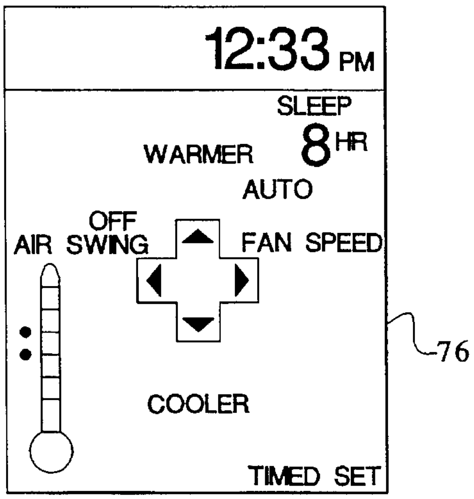

In FIG. 20L, there is illustrated the display resulting on the display element 76 after pressing of the SLEEP key 84 and pressing of the ENTER function to setting the number of hours to 8. The TIMED SET indicates that at some point in the future a TIMED START or STOP will occur. As illustrated, the display includes the simulated thermometer icon as well as the four-way arrow icon associated with the WARMER, COOLER, FAN SPEED and AIR SWING selection functions. Again, the WARMER selection function is associated with the up arrow, while the COOLER selection function is associated with the down arrow. The FAN SPEED selection function is associated with the right arrow, while the AIR SWING on/off select function is associated with the left arrow. In the top, right-hand corner is provided a display indicating the number of SLEEP HOURS selected.

Figure 20M:
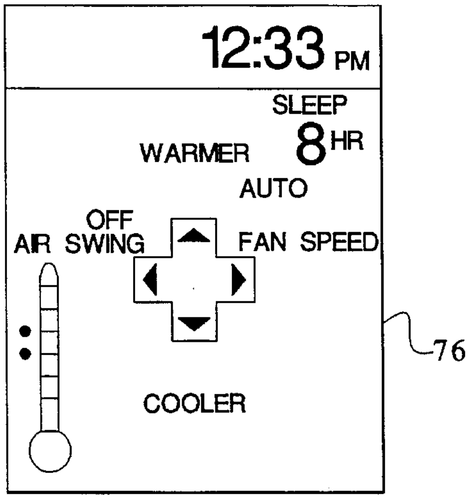

In FIG. 20M, there is illustrated the display on the display element 76 after pressing of the SLEEP button 84 and setting the time as described above either before a TIMED MODE has been set or after it has been cleared with the TIMED MODE button 96 and the CLEAR function. As further illustrated, the four-way arrow icon is associated with the WARMER, COOLER, FAN SPEED and AIR SWING selection functions such that the WARMER selection function is associated with the upper arrow, the COOLER selection function is associated with the down arrow, the FAN SPEED select function is associated with the right arrow and the AIR SWING on/off selection function is associated with the left arrow.

In FIGS. 21A to 21D, there is provided a schematic illustration of a circuit that can be implemented in the remote control unit 70 for effecting the operations described above.

Figure 21A:
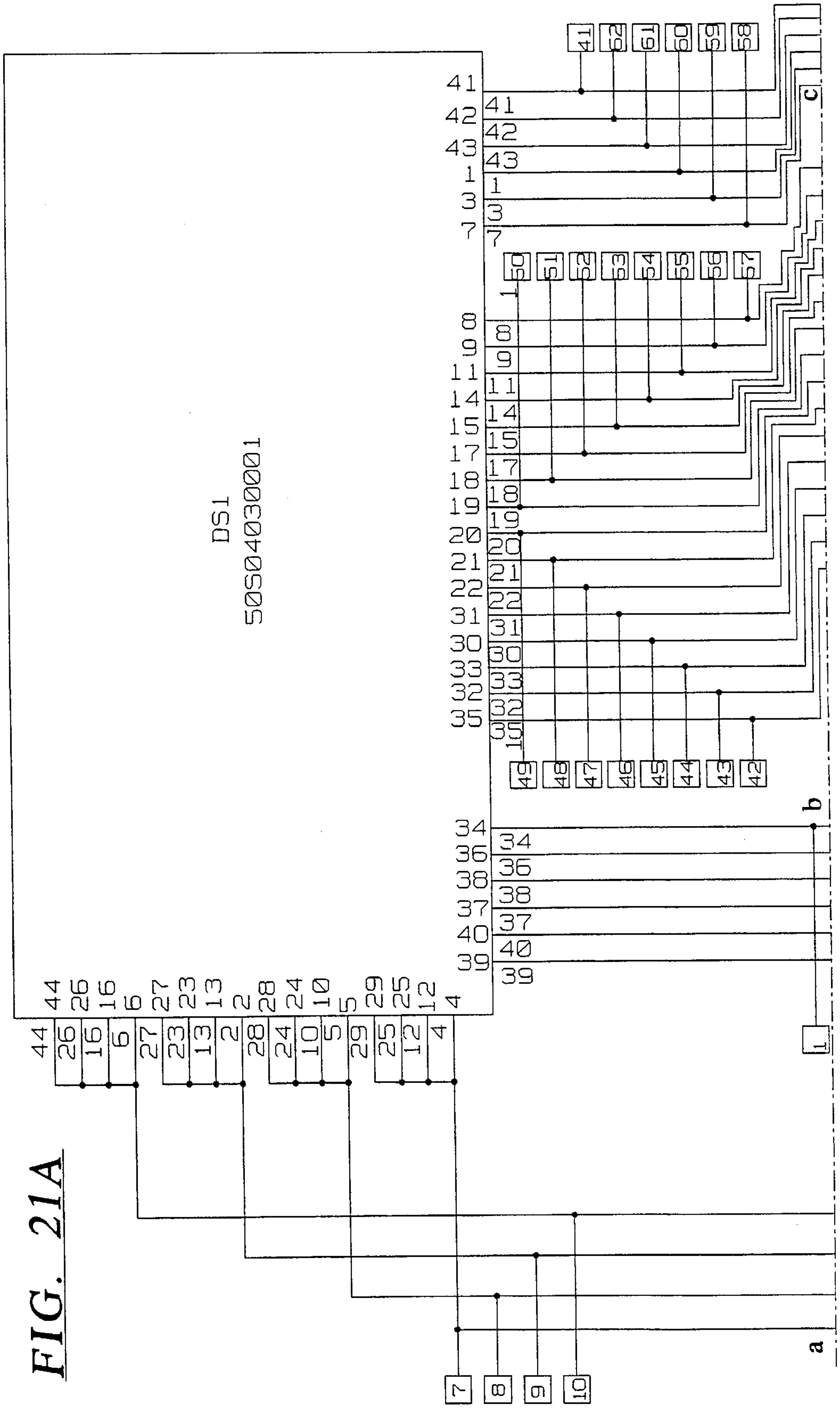
FIGS. 21A to 21D illustrate a circuit that can be employed in the remote control unit of FIG. 3.
Figure 21B:
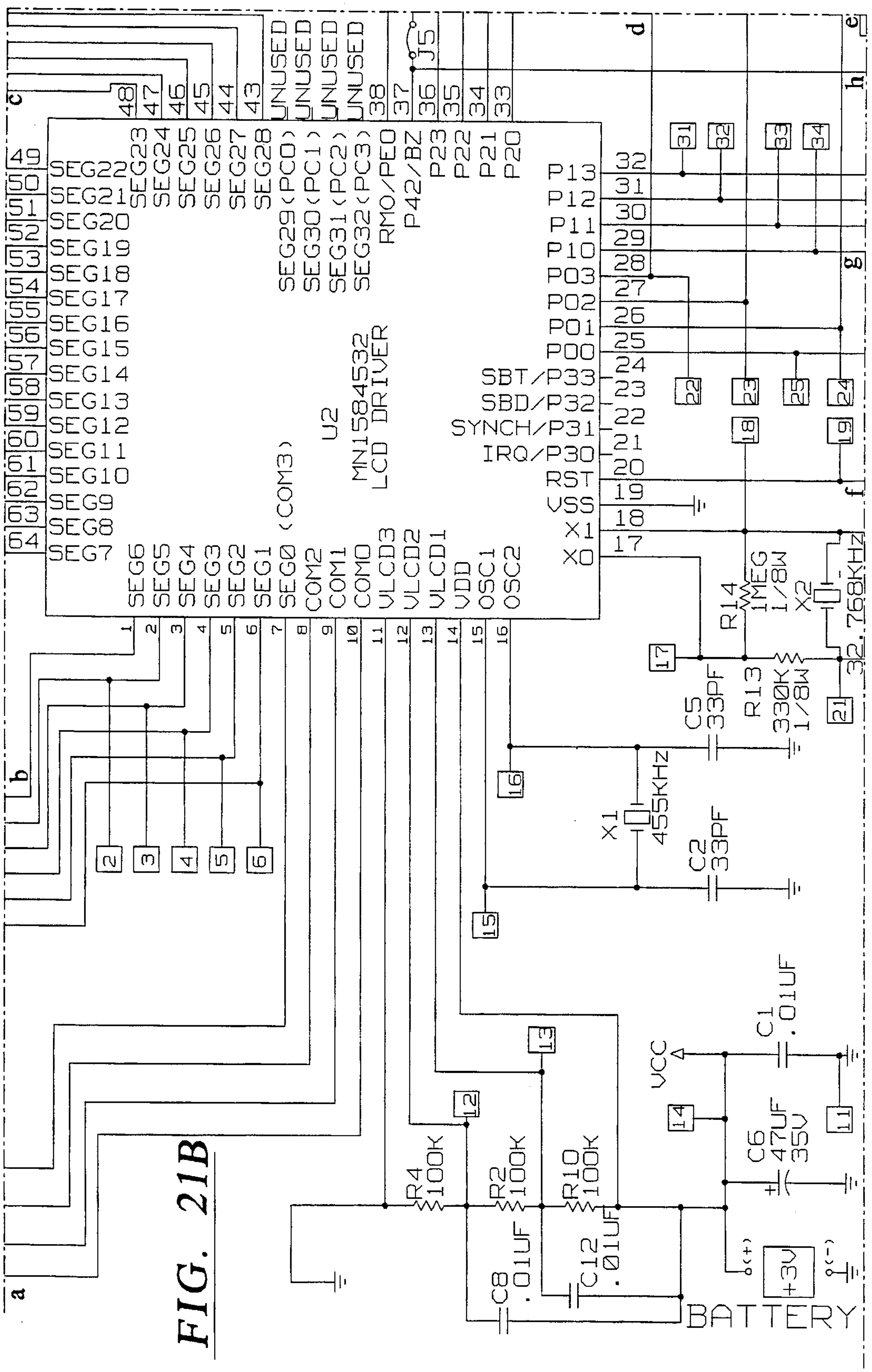
Figure 21C:
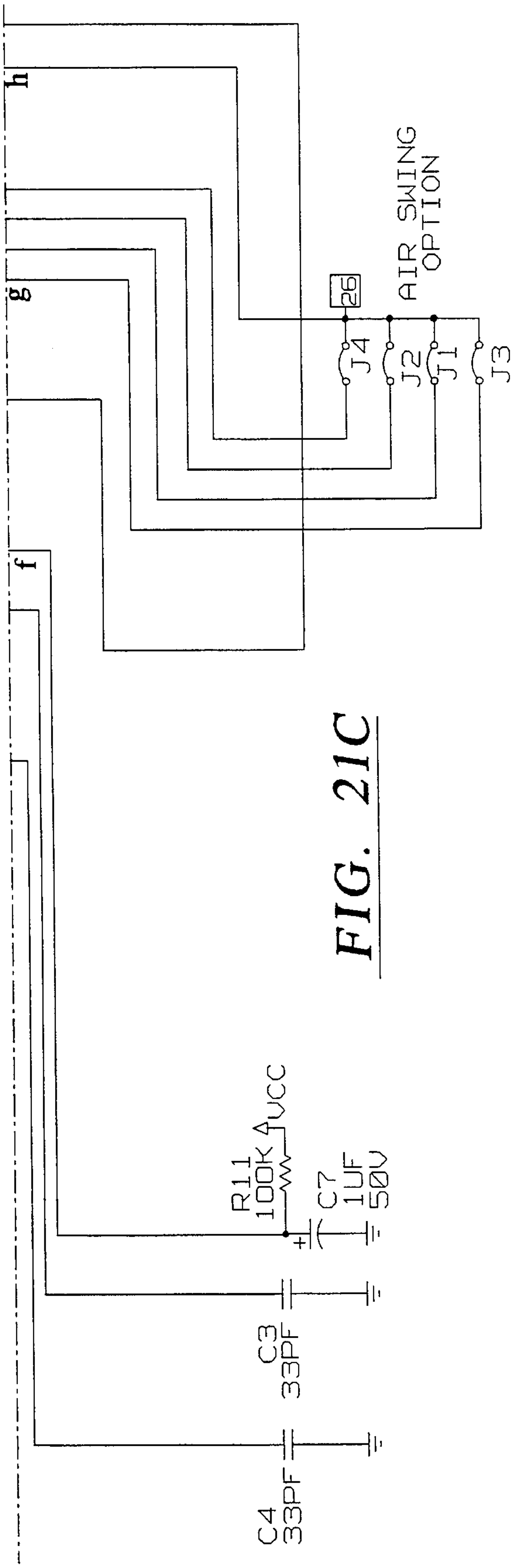
Figure 22:
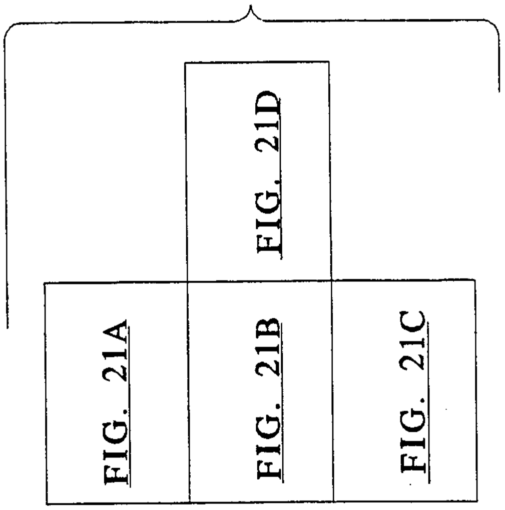
FIG. 22 illustrates the interrelationship between FIGS. 21A to 21D.

In FIG. 22, the interrelationship of the various FIGS. 21A through 21D is illustrated.

In FIG. 21A, importantly, there is provided a display DS1 incorporating the labels indicated above in a manner well known in the art to form the display element 76. Preferably, the display DS1 comprises a liquid crystal display.

In FIG. 21B, there is illustrated a processor U2 that is interconnected with the display DS1. Operatively coupled to this processor U2 is an infrared transmitter CR2 as well as various switches associated with the buttons discussed in connection with FIG. 3. Specifically, a sleep switch SW1A is associated with the sleep button 84, programming switch SW2A that is associated with a function permitting the setting of the clock for the changing of the SETTING1 or SETTING2 parameters, a menu switch SW3A is associated with the MENU button 80, a bottom arrow switch SW4A is associated with the down arrow of the four-way arrow key 82, right arrow switch SW5A is associated with the right arrow key of the four-way arrow key 82, a top arrow switch SW6A is associated with the up arrow of the four-way arrow key 82, a left arrow switch SW7A is associated with the left arrow of the four-way arrow key 82, an off switch SW8A is associated with the OFF button 90, auto cool switch SW9A is associated with the AUTO COOL button 88, a setting to switch SW10A is associated with the SETTING 2 button 94, a timed mode switch SW11A is associated with the TIMED MODE button 86, and a setting one switch SW12A is associated with the SETTING 1 button 92.

Figure 21D:
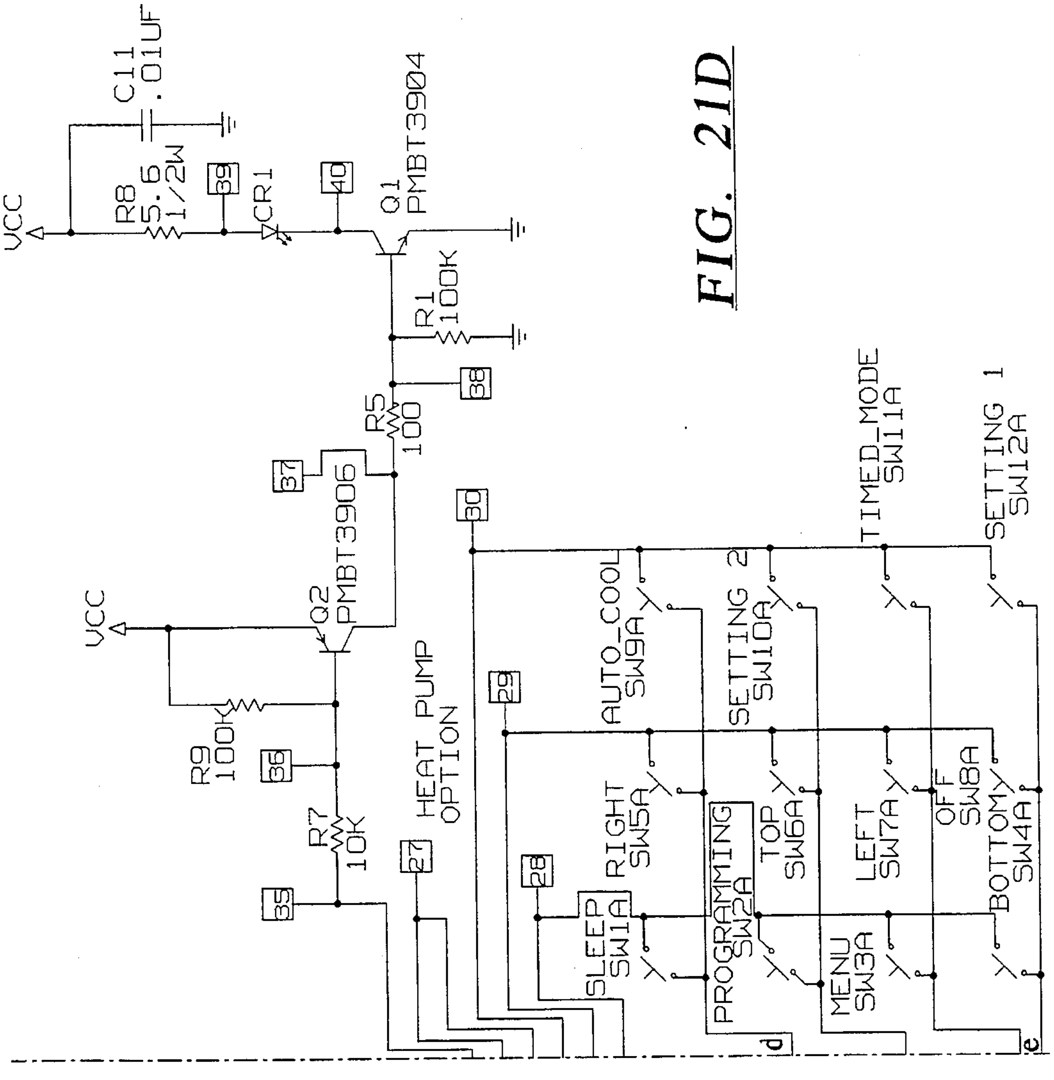

The remaining elements of the circuits illustrated in FIGS. 21A and 21D should be self-evident to those of ordinary skill in the relevant art, and, therefore, explanation thereof is not provided in this portion of the specification.

It can be appreciated that the resulting remote control unit 70 provides one, two, three and four-way arrow icons associatable with the four arrow keys that make up the four-way arrow key or directional controller 82. The arrows thus can be redefined to have different meanings depending on the displayed menu. By using a multiple-way arrow icon and redefining the keys or suitable directional controller associated with the icon to have different meanings reduces the need for a large number of keys and makes for a simpler operation of a remote control. Further, the operation reduces the number of keystrokes to accomplish most of the common programming tasks while a user can be led through the programming of the operation, for example, of the air conditioner of more complicated tasks.

It can also be appreciated that when the control is in the normal operating status, the touch of the up and down arrow keys will raise or lower the temperature set point because of their association with the WARMER and COOLER selection functions, respectively, or will allow the user to change the fan speed or to toggle the air swing function on and off, because of the association of the right and left arrow with those functions, respectively.

It further can be appreciated that with suitable reconfiguration, the four-way arrow key 82 can be replaced with another suitable directional controller, such as a joy stick, mouse, roller ball and other similar devices that provide for input by a user.

Although modifications and changes may be suggested by those skilled in the art, it is the intention of the inventors to embody within the patent warranted hereon all changes and modifications as reasonably and properly come within the scope of their contribution to the art.

We claim:

1. A remote control unit including an electronic circuit and a housing comprising:

a top side, a bottom side and a periphery extending between the top side and the bottom side, the housing having a longitudinal dimension and a lateral dimension, the bottom side being configured to include two supporting pads at opposite longitudinal portions of the bottom side and a rib extending between the two supporting pads, each of the pads providing support for the housing on a planar surface at at least two laterally spaced apart positions, recesses formed in the bottom side at opposite lateral edges of the bottom side so as to provide a space between the planar surface and the bottom side sufficient to enable a user to insert a fingertip in at least one of the spaces.

2. The remote control unit of claim 1, wherein the housing is made of a plastic.

3. The remote control unit of claim 1, wherein the top side, bottom side and periphery extending therebetween comprise a bipartite construction comprising a top half, including the top side and a portion of the periphery and a bottom half, including the bottom side and another portion of the periphery, the bottom half also including a battery receptacle.

4. The remote control unit of claim 3, wherein the bottom half includes a slidable cover that when removed exposes the battery receptacle.

5. The remote control unit of claim 1, wherein each of the supporting pads comprises a planar surface.

6. The remote control unit of claim 1, wherein the supporting pads and rib extending therebetween comprise a singular substantially planar supporting surface.

7. The remote control unit of claim 1, wherein the bottom side comprises a molded plastic member and the recesses are contoured recesses and wherein the rib is formed by molding the contoured recesses at opposite lateral edges of the bottom side such that the supporting pads and the contoured rib form a substantially hour glass profile.

8. The remote control unit of claim 1, wherein a window through which infrared signals transmitting window is provided at one longitudinal end of the housing within the periphery.

9. A remote control unit comprising:

a circuit operative to effect remote control functions; and a housing, the housing comprising: a top side, a bottom side and a periphery extending between the top side and the bottom side, the housing having a longitudinal dimension and a lateral dimension, the bottom side being configured to include two supporting pads at opposite longitudinal portions of the bottom side and a rib extending between the two supporting pads, each of the pads providing support for the housing on a planar surface at at least two laterally spaced apart positions, recesses formed in the bottom side at opposite lateral edges of the bottom side so as to provide a space between the planar surface and the bottom side sufficient to enable a user to insert a fingertip in at least one of the spaces.

10. The remote control unit of claim 9, wherein the housing is made of a plastic.

11. The remote control unit of claim 9, wherein the top side, bottom side and periphery extending therebetween comprise a bipartite construction comprising a top half, including the top side and a portion of the periphery and a bottom half, including the bottom side and another portion of the periphery, the bottom half also including a battery receptacle.

12. The remote control unit of claim 9, wherein the bottom half includes a slidable cover that when removed exposes the battery receptacle.

13. The remote control unit of claim 9, wherein each of the supporting pads comprises a planar surface.

14. The remote control unit of claim 9, wherein the supporting pads and rib extending therebetween comprise a singular substantially supporting surface.

15. The housing of claim 9, wherein the bottom side comprises a molded plastic member and the recesses are contoured recesses and wherein the rib is formed by molding the contoured recesses at opposite lateral edges of the bottom side such that the supporting pads and the contoured rib form a substantially hour glass profile.

16. The housing of claim 9, wherein a window through which infrared signals transmitting window is provided at one longitudinal end of the housing within the periphery.

17. A remote control unit for an air conditioner comprising:

a circuit operative to effect remote control functions; and a top side, a bottom side and a periphery extending between the top side and the bottom side, the housing having a longitudinal dimension and a lateral dimension, the bottom side being configured to include two supporting pads opposite longitudinal ends of the housing and a rib extending between the two supporting pads, each of the pads providing support for the housing on a planar surface to laterally spaced apart positions, portions of the bottom side at opposite lateral edges of the bottom side being removed so as to provide a space between the planar surface and the bottom side sufficient to enable a user to grasp the housing and insert fingertips in at least one of the spaces.

18. The remote control unit of claim 17, wherein the housing is made of a plastic.

19. The remote control unit of claim 17, wherein the top side, bottom side and periphery extending therebetween comprise a bipartite construction comprising a top half, including the top side and a portion of the periphery and a bottom half, including the bottom side and another portion of the periphery, the bottom half also including a battery receptacle.

20. The remote control unit of claim 17, wherein the bottom half includes a slidable cover that when removed exposes the battery receptacle.

21. The remote control unit of claim 17, wherein each of the supporting pads comprises a planar surface.

22. The remote control unit of claim 17, wherein the supporting pads and rib extending therebetween comprise a singular substantially planar supporting surface.

23. The remote control unit of claim 17, wherein the bottom side comprises a molded plastic member and the recesses are contoured recesses and wherein the rib is formed by molding the contoured recesses at opposite lateral edges of the bottom side such that the supporting pads and the contoured rib form a substantially hour glass profile.

24. The remote control unit of claim 17, wherein a window through which infrared signals transmitting window is provided at one longitudinal end of the housing within the periphery.

25. A remote control unit including an electronic circuit and a housing having longitudinal and lateral dimensions, comprising:

a bottom side with two support pads, each of the two pads being configured to support the housing on a planar surface at at least two laterally spaced apart positions, two contoured recesses formed at opposite spaced apart lateral positions on the bottom side to provide spaces between the planar surface and the housing so that the housing is lifted from the planar surface by insertion of one or more fingers in the spaces, the recesses forming between them a rib that extends between the two pads.

* * * * *